US006262594B1

(12) United States Patent
Cheung et al.

(10) Patent No.: US 6,262,594 B1
(45) Date of Patent: Jul. 17, 2001

(54) APPARATUS AND METHOD FOR CONFIGURABLE USE OF GROUPS OF PADS OF A SYSTEM ON CHIP

(75) Inventors: Gordon Kwok-Lung Cheung, Cupertino; Ali Alasti, Los Altos, both of CA (US)

(73) Assignee: ATI International, SRL (BB)

( * ) Notice: Subject to any disclaimer, the term of this patent is extended or adjusted under 35 U.S.C. 154(b) by 0 days.

(21) Appl. No.: 09/435,116

(22) Filed: Nov. 5, 1999

(51) Int. Cl.$^7$ .................................................. H03K 19/173
(52) U.S. Cl. .................................................. 326/38; 326/41
(58) Field of Search .................................. 326/38, 39, 41, 326/37

(56) References Cited

U.S. PATENT DOCUMENTS

| | | | |
|---|---|---|---|
| 5,379,356 | 1/1995 | Purcell et al. ........................... | 382/56 |
| 5,414,638 | 5/1995 | Verheyen et al. ...................... | 364/489 |
| 5,448,496 | * 9/1995 | Butts et al. ............................. | 364/489 |
| 5,598,514 | 1/1997 | Purcell et al. .......................... | 395/118 |
| 5,701,507 | 12/1997 | Bonneau, Jr. et al. ............... | 395/800 |
| 5,742,180 | 4/1998 | DeHon et al. ........................... | 326/40 |
| 5,943,490 | * 8/1999 | Sample ............................. | 395/500.49 |
| 5,960,191 | * 9/1999 | Sample et al. .................... | 395/500.49 |

OTHER PUBLICATIONS

R. Zaks, et al. "From Chips to Systems: An Introduction to Microcomputers", 1981.
N. Alexandridis, "Microprocessor System Design Concepts", Computer Science Press, 1984, pp. 168–181.
N. Alexandridis, "Microprocessor System Design Concepts", Computer Science Press, 1984, pp. 209–212.
EETInfo No. 40@www.eetinfo.com, "Claim Your Independence!", Electronic Engineering Times, Mar. 29, 1999, p. 85.
EETInfo No. 36 @www.eetinfo.com, "Outrageous Deadlines To Coexist Peacefully." Electronic Engineering Times, Mar. 29, 1999, p. 79.
www eet.com, Electronic Engineering Times, Mar. 29, 1999.
Bill Cordan, "Configurable Memory Control for System–on–Chip Designs", 1999.
Palmchip Corporation, "Coreframe Architecture Solves Problems For System–on–Chip Integration".

* cited by examiner

*Primary Examiner*—Michael Tokar
*Assistant Examiner*—Anh Q. Tran
(74) *Attorney, Agent, or Firm*—Skjerven, Morrill, Mac Pherson; Omkar K. Suryadevara

(57) ABSTRACT

An integrated circuit chip has pads that are grouped into a number of groups, and also has functional modules that share, among each other, use of two or more groups of the pads (also called "external function" groups), for transferring signals (such as data signals and control signals) to or from external circuitry. Each functional module has one or more groups of terminals (also called "internal function" groups) for carrying these signals. The number I of internal functional groups is greater than another number E of external function groups. Therefore, at any given time, a number I-E internal function groups are uncoupled (i.e. not coupled to any pads of the integrated circuit chip). Couplings among groups are implemented independent of each other in a crossbar switch having I internal ports and E external ports, and at least I-E internal ports are always uncoupled. Each internal port is hardwired to an internal function group, and each external port is hardwired to an external function group. During normal operation, the crossbar switch temporarily couples one or more external ports to a corresponding number of internal ports. The temporary couplings inside the crossbar switch may be changed only on power-up, or may be changed at any time during operation. A configuration circuit indicates to the crossbar switch the to-be-made couplings. The configuration circuit may also supply disable signals and enable signals to various functional modules, and/or the external circuits, if couplings therebetween can be changed during operation.

22 Claims, 13 Drawing Sheets

APPARATUS AND METHOD FOR CONFIGURABLE USE OF GROUPS OF PADS OF A SYSTEM ON CHIP

BACKGROUND

Systems are normally implemented by mounting a number of discrete components on a printed circuit board. However, implementing the circuitry of discrete components in a single integrated circuit chip yields advantages of cost reduction, low power consumption, space savings and ruggedness. Such a single chip (also called "system-on-chip" and abbreviated as "SOC") 1 (see FIG. 1A) has a number of functional modules 2–9 that provide functions different from each other, and may include, for example, a central processing unit (CPU) module 2, a random access memory (RAM) module 3, and a liquid crystal display (LCD) module 4. See page 85 of Electronic Engineering Times, Mar. 29, 1999(an advertisement). It is well known to permanently couple (i.e. hardwire) functional modules 2–9 to a group of predetermined pads 1A–1P (not all pads in FIG. 1 are labeled) for coupling to external circuitry.

Among the pads (e.g. pads 1I–1N) that are hardwired to CPU module 2, some pads (e.g. pads 1I–1K) may be used in a multiplexed manner by CPU module 2. Specifically, Intel 8086 and Zilog Z8000 CPUs provide a 16-bit address/data bus that multiplexes the low-order sixteen address bits with the 16-bit data word. Additionally, the 8086 CPU multiplexes four address bits with four status signals on four separate pads. Also, the Intel 8085 CPU has an 8-bit address/data bus that multiplexes the lower half of a 16-bit address with the 8-bit data byte. See pages 172–173 and 209–212 of the book entitled "Microprocessor System Design Concepts" by Nikitas A. Alexandridis, Computer Science Press, 1984.

Moreover, Purcell et al. (see U.S. Pat. No. 5,379,356) describe a single chip (called "CL950 chip" at column 6, lines 5–9) having at least a processor, a decoder coprocessor, and a motion compensation coprocessor that are connected to a global bus (see column 6, lines 10–13 and lines 17–33). The global bus in turn is coupled via "Pad and FFS" to a memory bus that is external to the single chip (e.g. coupled to DRAM as described at column 6, lines 53–55). Purcell et al. also state that "by looping back the CAS signal on the output pin, this embodiment can monitor the time at which the CAS signal is asserted at the external DRAM. Therefore, the uncertainty as to whether the external DRAM receives the column address is removed . . . " (column 7, lines 3–8). See also U.S. Pat. No. 5,598,514 for another description of the global bus.

U.S. Pat. No. 5,701,507 describes an integrated circuit having several groups of processors and memories, wherein "each processor . . . has direct communication with each memory . . . via a crossbar link . . . " (column 3, lines 1–11). Moreover, U.S. Pat. No. 5,742,180 (see FIG. 1B) describes a gate array, wherein "nine (3×3) subarrays are connected by associated bidirectional cross bars . . . [c]ommunication at the edge of the nine subarrays goes off-chip via input/output pads or pins . . . " (column 6, lines 28–31).

Furthermore, U.S. Pat. No. 5,036,473 describes a "partial crossbar interconnect [in which] the I/O pins of each logic chip are subdivided into proper subsets, using the same division on each logic chip. The pins of each crossbar chip are connected to the same subsets of pins from each and every logic chip. Thus crossbar chip 'n' is connected to subset 'n' of each logic chip's pins. As many crossbar chips are used as there are subsets, and each crossbar chip has as many pins as the number of pins in the subset times the number of logic chips. Each logic chip/crossbar chip pair is interconnected by as many wires, called paths, as there are pins in each subset". See column 15, line 63 to column 16, line 6.

SUMMARY OF THE INVENTION

In accordance with the invention, an integrated circuit chip has pads (portions of electrical conductors formed on the chip's surface and normally used for receiving external connections, sometimes called "bond pads") that are grouped into a number of groups, and also has circuitry to allow functional modules in the chip to share, among each other, use of two or more groups of the pads (also called "external function" groups), for transferring signals (such as data signals and control signals) to/from circuitry external to the chip. Each of the functional modules inside the chip is electrically coupled to and decoupled from an external function group as and when necessary to use the pads for external communications. At any time, only one functional module communicates with pads of a given external function group. Sharing of pads as described herein allows the integrated circuit chip to have fewer total pads than otherwise required for transferring data and control signals to/from external circuitry in the absence of such sharing.

In one embodiment, a first functional module in the chip performs a predetermined function that is different from a second functional module, so that the chip can be configured for use of one of these two functional modules. Such a chip may include additional such functional modules thereby to implement a system-on-chip (SOC). Each functional module in the chip has one or more groups of terminals (also called "internal function" groups) for transferring signals to/from the external function groups. As an important aspect of this particular embodiment, a number T of internal function groups is greater than another number S of external function groups. The number of elements (e.g. terminals or pads) in each group are identical to the number of elements in any other group. Therefore, at any given time, each external function group is coupled to only one internal function group, and a number T-S internal function groups are uncoupled from the external function groups (i.e. not coupled to any pads of the integrated circuit chip). So, at any given time, at least one functional module of the integrated circuit chip is not used or is disabled (e.g. if all T-S internal function groups are part of the disabled functional module) in this embodiment.

In one implementation, the system-on-chip includes a switch having T internal ports and S external ports, and for the above-discussed reasons at least T-S internal ports are left uncoupled by the switch. During normal operation of the system-on-chip, the switch (such as a "crossbar switch") temporarily couples one or more external ports to a corresponding number of internal ports. However, each internal port is coupled permanently (also referred to as "hardwired") to an internal function group, and vice versa. Moreover, each external port is hardwired to an external function group and vice versa. In one embodiment, the coupling between each external port and a corresponding external function group does not include any switching circuitry, e.g. may include only bus drivers of the type well known in the art.

In one variant, the temporary couplings inside the switch are changed only on power-up (also called "static" couplings) of the system-on-chip. Such static couplings allow a board designer to use the same chip on different boards (each of which may require a different one of the modules to be coupled to external circuitry) by using different static couplings in the switch depending on the requirements of the different boards. In another variant, the temporary couplings inside the switch can be changed at any time during operation (also called "dynamic" couplings), thereby to allow the system-on-chip to dynamically reconfigure the use of a limited number of external function groups among a larger number of internal function groups.

In addition to the switch, the system-on-chip includes a configuration circuit that indicates to the switch specific couplings to be made among the various ports (e.g. that a first internal port is to be coupled to a second internal port and vice versa). If the specific couplings are static couplings then such couplings can be held in, e.g. an erasable read-only-memory included in the system-on-chip. Such a memory may be programmed with different values of control signals, depending on the requirements of different boards. In the variant of a chip that implements one or more dynamic couplings, the configuration circuit also supplies an enable signal to either or both of a functional module and a corresponding external circuit that are being coupled together. Therefore, a system-on-chip with dynamic couplings has, in one embodiment, an additional port that is hardwired to the configuration circuit for carrying enable and disable signals to one or more external circuits.

Use of such enable and disable signals (also called "control signals") eliminates the need for address signals transmitted by or received by the system-on-chip to respectively distinguish between multiple external circuits and multiple functional modules. Moreover, use of a switch and a configuration circuit to form dynamic couplings between internal ports and external ports allows such couplings to be changed as necessary. Also, the static couplings can be changed by simply turning power off and on (after appropriately changing the signals provided by the configuration circuit). Depending on the implementation, immediately after power-up and during a built-in-self-test (BIST), the configuration circuit can indicate to the crossbar switch couplings (also called "test" couplings) that interconnect two internal ports (or two external ports), so that a signal generated at one port can be sampled at the other port to verify operability of the two ports (and operability of the crossbar switch). Such test couplings can be used for loop back testing of internal function modules (or external circuits). Once the BIST is completed successfully, the configuration circuit can indicate couplings for use of Ethe functional modules with external circuits during normal operation.

So, a system-on-chip having a switch and a configuration circuit to configure the switch allows a greater number of internal ports to be coupled to a limited number of external ports as described herein, and provides a cost-effective and flexible implementation for coupling a number of modules of different functionality to different external circuitry.

DETAILED DESCRIPTION

The present invention relates to an apparatus and method for a number of functional modules located inside an integrated circuit chip (also referred to as "system-on-chip," abbreviated as "SOC") to share a limited number of pads of the chip, for transferring data to and from circuitry external to the chip. Specifically, in one embodiment, chip 10 (FIG. 2A) includes a switch 11 that has two kinds of ports: internal ports 12A–12T (wherein $A \leq J \leq T$, T being the total number of internal ports) that are hardwired (i.e. permanently coupled) to functional modules 21–26, and external ports 13A–13S (wherein $A \leq I \leq S$, S being the total number of external ports) that are hardwired to groups (also called "external function" groups) 30A–30S of pads (not shown individually in FIG. 2A; see individual pads 16–19 of group 30A in FIG. 2B) of chip 10.

The number of pads in the "S" external ports 13A–13S are fewer in number than the number of pads in the "T" internal ports 12A–12T so that at least one of the groups 30A–30S is shared by two or more of functional modules 21–26. Such sharing allows chip 10 to have fewer pads than the number of pads otherwise required (in the absence of sharing). Moreover, sharing of two or more groups 30A–30S of pads by use of switch 11 eliminates the need for an address bus that is required if only one group of pads are shared among all functional modules 21–26. Preferably, but not necessarily, each of function modules 21–26 in chip 10 is formed during fabrication of chip 10 by semiconductor processing methods, and without the programming of an array of gates (such as the electrical programming of a FPGA).

Moreover, each of functional modules 21–26 performs a predetermined function that is different from another predetermined function performed by another of functional modules 21–26, thereby to form a system-on-chip (SOC). For example, one functional module can include a display controller that generates RGB signals, and another functional module can include a video output interface that generates YUV signals, and these modules may be alternatively connected to a panel display or a television set respectively.

Figure 1A:
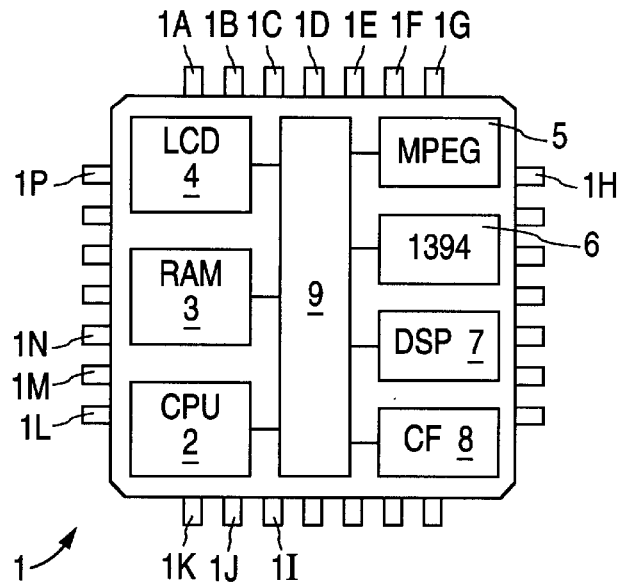
FIGS. 1A and 1B are block diagrams of a prior art system-on-chip and a prior art programmable gate array respectively.
Figure 1B:
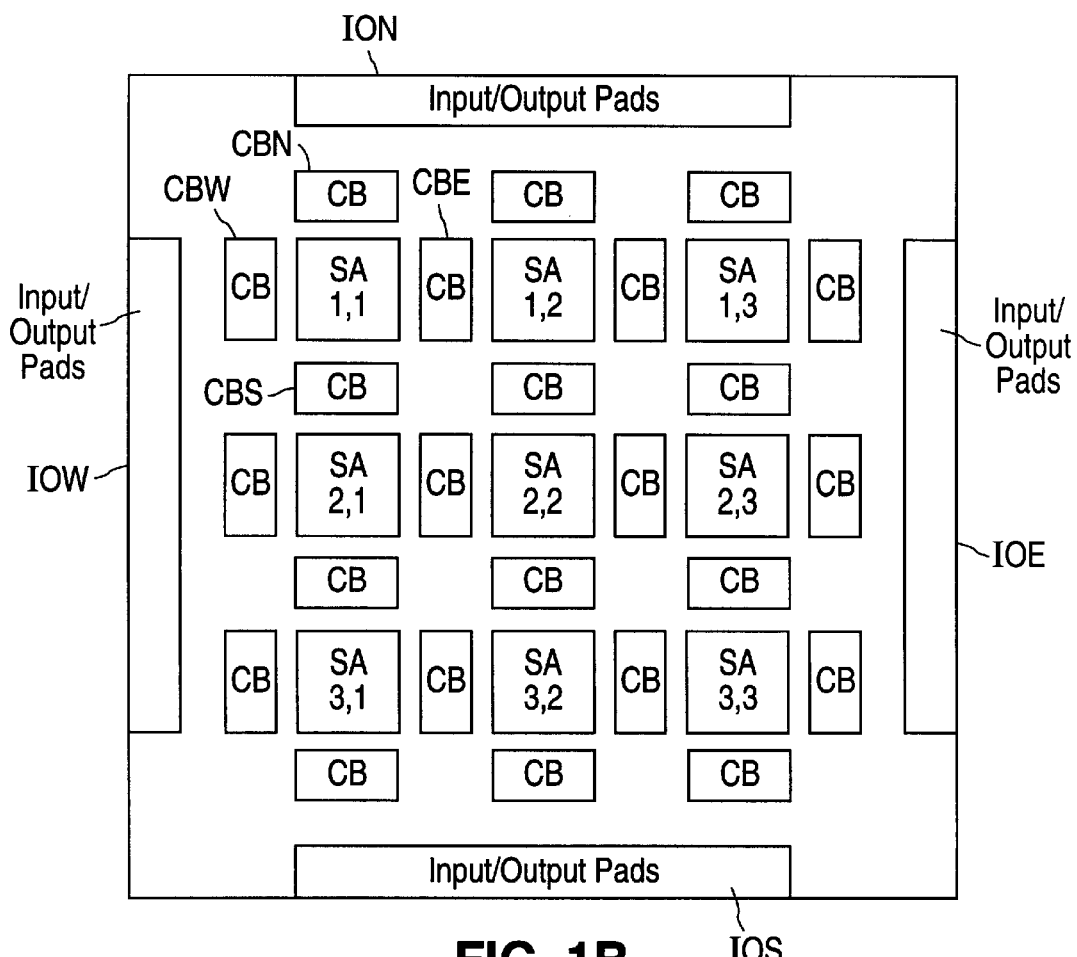
Figure 2A:
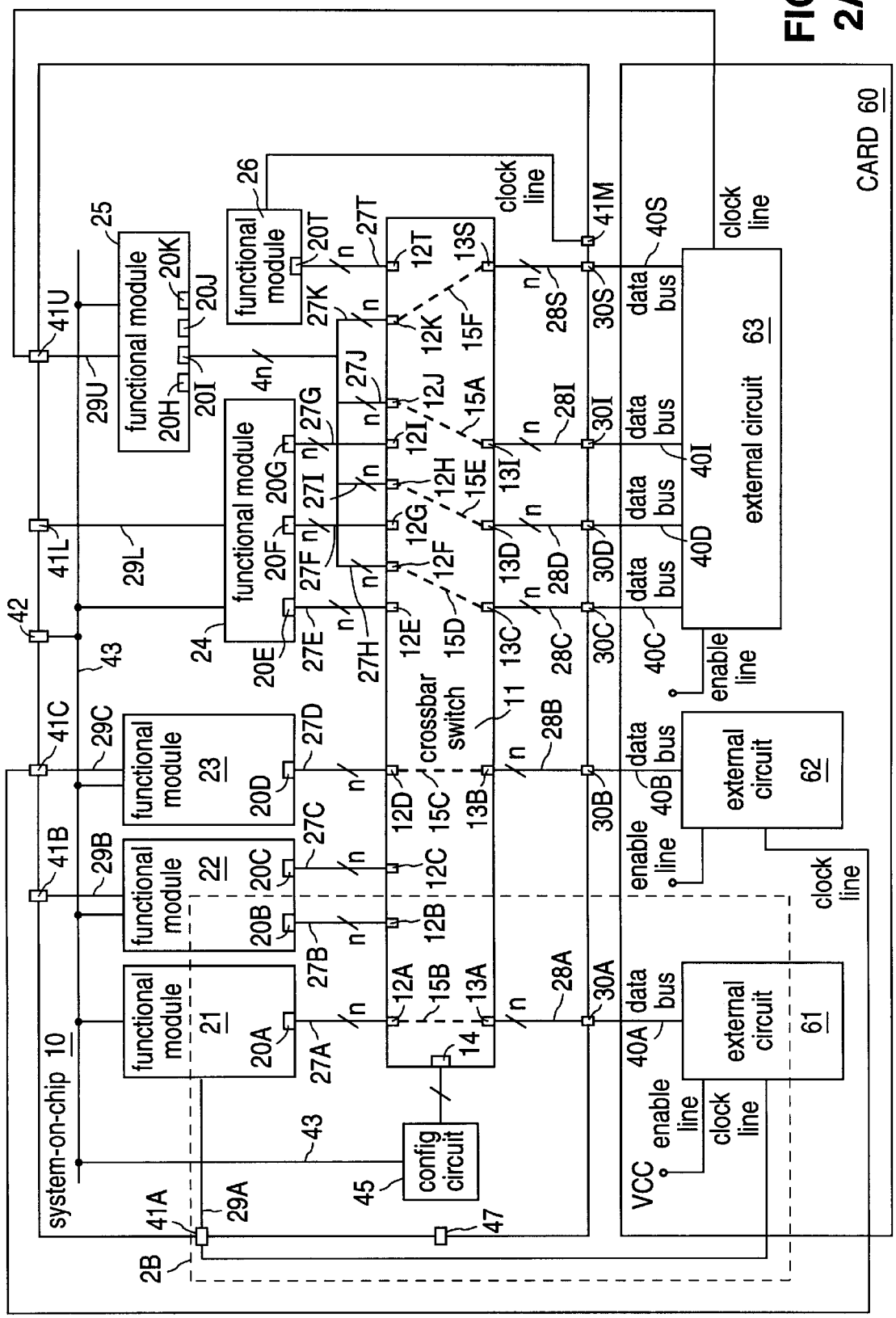
FIG. 2A illustrates, in a high-level block diagram, a system-on-chip having a switch for sharing of a limited number of pads among multiple functional modules in one embodiment of the invention.
Figure 2B:
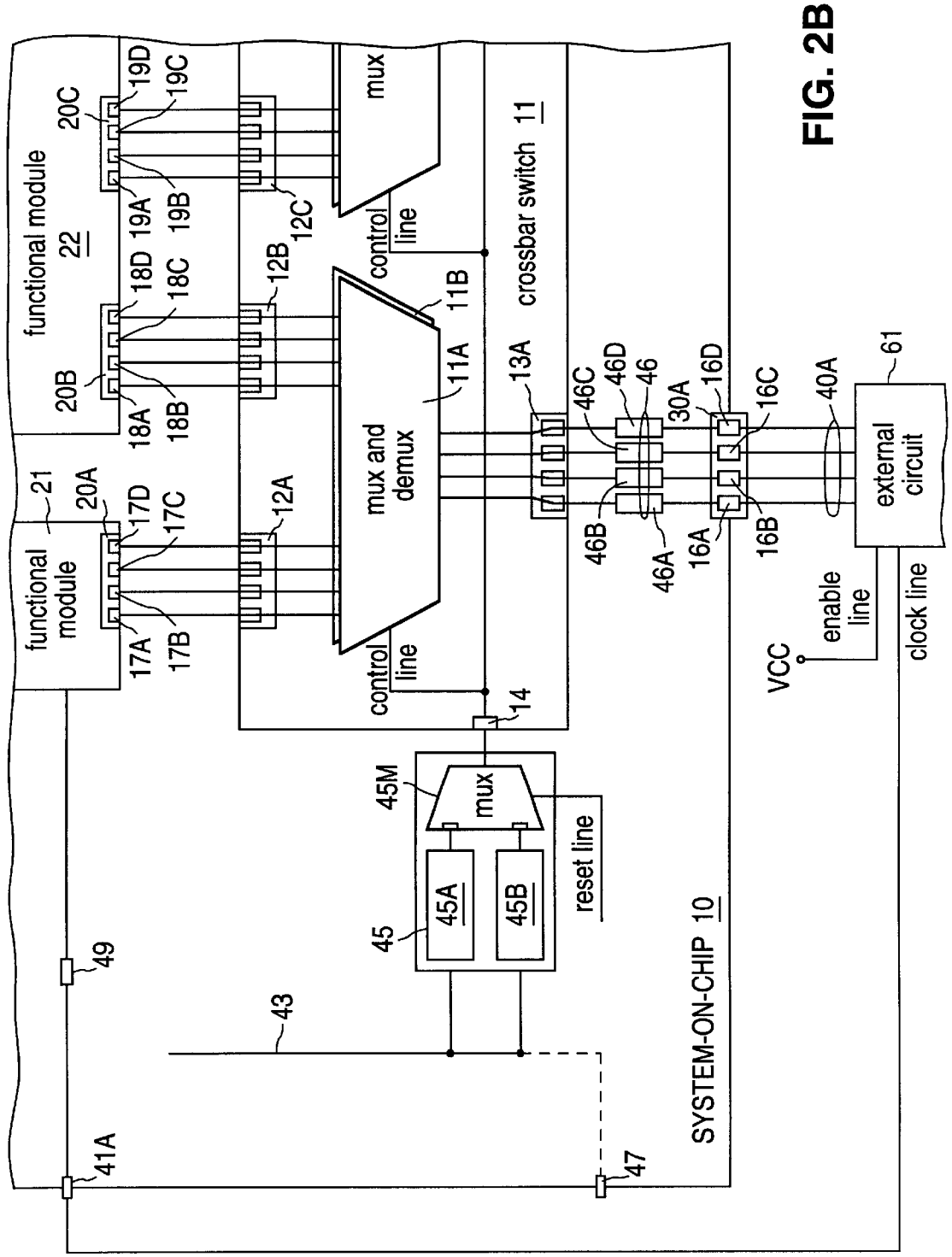
FIG. 2B illustrates, in low-level block diagram, circuitry enclosed within dashed box 2B of FIG. 2A in one implementation of the invention.

Each of the above-described pads (in each of groups 30A–30S) is an enlarged portion of an electrical conductor to which a connection to external circuitry 60 can be made (e.g. via ports 40A–40S). Note that although only four pads 16A–16D are illustrated in FIG. 2B as forming a group 30A, any predetermined number n of pads can be included in each group 30I (FIG. 2A). The number n can be, for example, 8 or 16 depending on the implementation. Moreover, functional modules 21–26 have a number of groups (also called "internal function" groups) 20A–20S of n terminals that are hardwired to the respective internal ports 12A–12T. For example, terminals 17A–17D, 18A–18D and 19A–19D (FIG. 2B) are included in the respective internal function groups 20A–20C.

Note that the same number n of terminals are included in each of internal function groups 20A–20T (FIG. 2A) as the number n of pads in each of external function groups 30A–30S. For example, in the implementation illustrated in FIG. 2B, the number of terminals in group 20A is 4, and the same number of terminals (i.e. 4) are present in other internal function groups 20B and 20C, and also the same number (i.e. 4) of pads are present in each external function group (e.g. group 30A).

Internal function groups 20A–20T are coupled to internal ports 12A–12T by the respective buses 27A–27T that are formed as electrical conductors in chip 10 (with no intervening circuitry). External function groups 30A–30S are coupled to external ports 13A–13S by links 28A–28T that may include circuitry normally used to interface to pads of chip 10 (e.g. output drivers and/or input buffers 46A–46D are illustrated in FIG. 2B as coupling external port 13A to external function group 30A). Therefore, a link 281 may have only an output driver as illustrated in FIG. 2D and no other circuitry.

Figure 3:
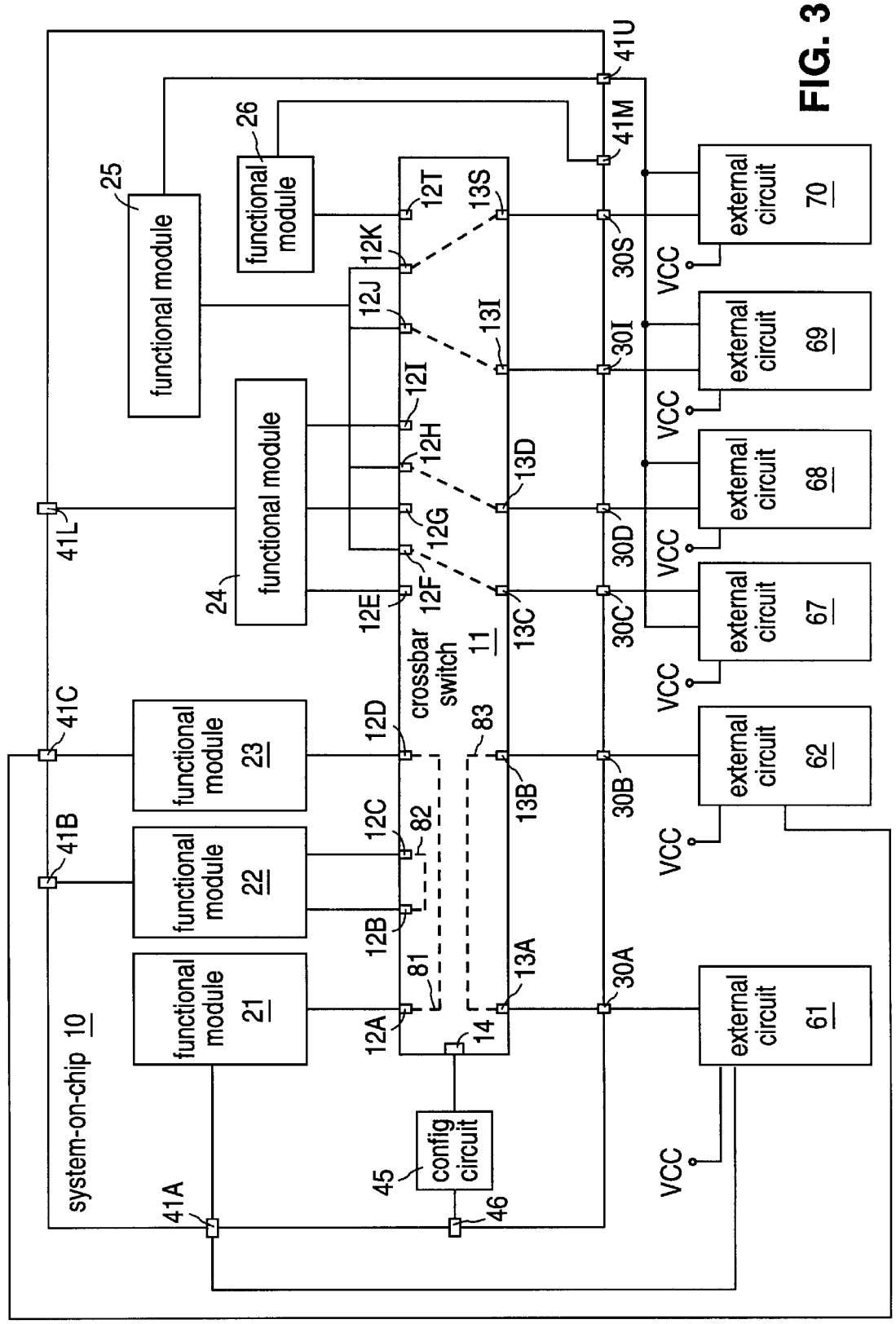
FIG. 3 illustrates, in a high-level block diagram, alternative couplings within the switch of the system-on-chip of FIG. 2A used in testing.

Switch 11 can be, e.g. a crossbar switch that is only capable of coupling one of ports 12A–12T and 13A–13S to another of these ports (i.e. all terminals within such a port are coupled or decoupled as a group, and not individually). For example, during normal operation, switch 11 forms temporary couplings between ports 12A–12T and ports 13A–13S to allow two or more functional modules 21–26 to share (e.g. over time) an external function group. As another example, during testing, switch 11 may form temporary couplings between two functional groups (as discussed below in reference to FIGS. 3A and 3B). Moreover, the number S of external ports 13A–13S (FIG. 2A) is smaller than the number T of internal ports 12A–12T. Therefore, at any time during normal operation, at least T-S internal ports (e.g. internal ports 12B, 12C, 12E, 12G, 12I and 12T in FIG. 2A) remain uncoupled from all of external ports 13A–13S.

In one implementation, couplings 15A–15F (FIG. 2A) can be changed only on power-up of system-on-chip 10. Couplings (also called "static" couplings) 15A–15F being changeable during power-up allows a board designer to use the same chip 10 on different boards (each of which may require a different one of the modules to be coupled to external circuitry). In another implementation, couplings 15A–15F can be switched at any time during operation (also called "dynamic" couplings), thereby to allow system-on-chip 10 to dynamically reconfigure (without power on/off or system reset) the use of a limited number of external function groups 30A–30S among a larger number of internal function groups 20A–20T.

Switch 11 can be implemented in any manner well known in the art in view of the disclosure. In one implementation, switch 11 is formed by combinations of multiplexers and demultiplexers (such as mux 11A and demux 11B in FIG. 2B) that switch between fixed width buses that couple internal ports 12A–12T to external ports 13A–13S. The multiplexers and demultiplexers have control lines coupled to port 14, and form temporary couplings among ports 12A–12T and 13A–13S in response to a control signal at port 14. Note that additional multiplexers and demultiplexers (of the type illustrated in FIG. 2B) may be included in switch 11 for coupling two internal ports to each other (and/or two external ports to each other) for testing (as discussed below in reference to FIGS. 3A and 3B).

Preferably, but not necessarily one predetermined manner of couplings between a group of pads and a corresponding group of terminals is a straight through order, wherein a first pad 16A (FIG. 2B) of an external function group 30A is coupled to a first terminal 17A of the internal function group 20A, a second pad 16B is coupled to a second terminal 17B of the internal function group 20A, and so on.

Note that switch 11 has limited functionality as compared to a general purpose crossbar switch (which can couple any pad to any other pad and therefore any port to any other port). Specifically, at any given time, not all internal ports 12A–12T can be coupled to external circuitry, due to the smaller number S of external ports 13A–13S, as compared to the number T of internal ports 12A–12T. Note that crossbar switch 11 can only couple terminals of one group as a whole to corresponding pads of another group, in a predetermined manner (i.e. switch 11 cannot couple any pad to any terminal).

Specifically, switch 11 described herein is different from a crossbar switch in a field programmable gate array (abbreviated as "FPGA") that can couple any internal gate to any external pad. For example, switch 11 as described herein cannot couple the individual pads of a single external function group 13I to each other. Moreover, switch 11 described herein cannot couple the terminals of the same internal function group (e.g. group 20B) to each other (e.g. terminal 18A cannot be coupled by switch 11 to terminal 18B). Also, switch 11 described herein cannot couple some terminals of an external function group (e.g. group 30A) to one internal function group (e.g. group 20A) while coupling other terminals of the same external function group (e.g. group 30A) to another internal function group (e.g. group 20B).

In one embodiment, functional modules 21–26 described herein are formed simultaneously relative to one another during fabrication of the integrated circuit chip in the normal manner, i.e. the functional modules are formed without the programming of a gate array. Also, unlike the programming of a gate array, the couplings of one or more of functional modules 21–26 to external ports 13A–13S can be dynamically reconfigured at any time during normal operation.

Switch 11 described herein is also different from circuitry in a multiple processor system that allows sharing of an external bus among the various processors for at least two reasons. First, such a multiprocessor system normally shares just one bus, whereas switch 11 has a number of external ports 13A–13S each of which may be shared among multiple functional modules 21–26. Second, the single shared bus of the multiprocessor system carries address signals in addition to data and control signals, whereas each external port (e.g. port 13I) of switch 11 does not carry any address signals. Depending on the implementation, one or more control signals (such as a "clock" signal or an "enable" signal) may be carried by a corresponding number of pads that are hardwired to the respective functional modules.

In addition to switch 11, chip 10 also includes a configuration circuit 45 that is coupled to a control port 14 of switch 11. Configuration circuit 45 indicates to switch 11 the specific couplings 15A–15F to be made among the various ports 12A–12T and 13A–13S (e.g. that a first internal port 12A is to be coupled to a second internal port 13A, and vice versa). Such use of a switch 11 allows couplings 15A–15F between internal ports 12A–12T and external ports 13A–13S to be changed as necessary.

Specifically, on power-up, circuit 45 passes a default control signal (also called "first control" signal) to port 14, and in response switch 11 couples (see act 91 in FIG. 2C) at least a first external port 13I to a first internal port 12J (as illustrated by coupling 15A that is shown as a dashed line in FIG. 2A). Thereafter, circuit 45 checks (see act 92 in FIG. 2C) if the current coupling(s) need to be changed (e.g. as may be indicated by a control signal at a port 47). If so, circuit 45 drives the appropriate signals to port 14 for resetting the currently coupled modules (as illustrated by act 93 in FIG. 2C) and indicates new couplings (e.g. between first external port 13I and a second internal port 12I (as illustrated by coupling 15K in FIG. 2D).

Once appropriate couplings are formed by switch 11 (either during act 91 or during act 93), circuit 45 enables the two modules that are coupled by crossbar switch 11, thereby to allow communication therebetween. For example, if the "yes" branch was taken from act 92, then after act 93, circuit 45 transitions to act 94 (FIG. 2C), to enable a recipient module (e.g. module 24) and thereafter enable a sender module (e.g. module 66 in FIG. 2D). The recipient module is enabled prior to enabling the sender module to ensure that any data sent by the sender module reaches the recipient module after the recipient module has been enabled, otherwise such data may be lost. Next, in act 95, such data is transferred from the sender module to the recipient module, in the normal manner. Note that in act 92, if no change is required from the default couplings, circuit 45 directly performs act 94 (described above).

Figure 2C:
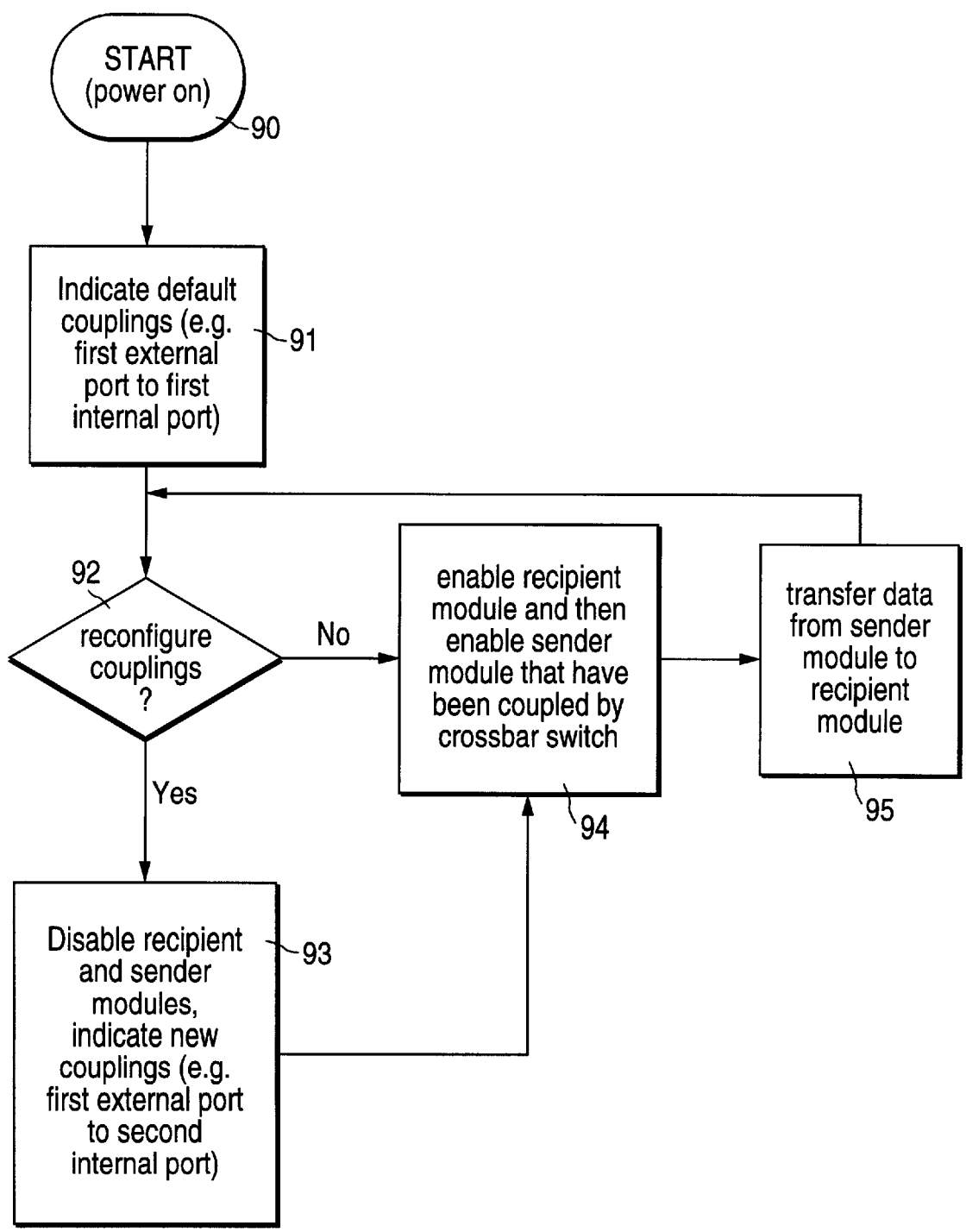
FIG. 2C illustrates, in a flow chart, acts performed in the implementation of FIG. 2B.
Figure 2D:
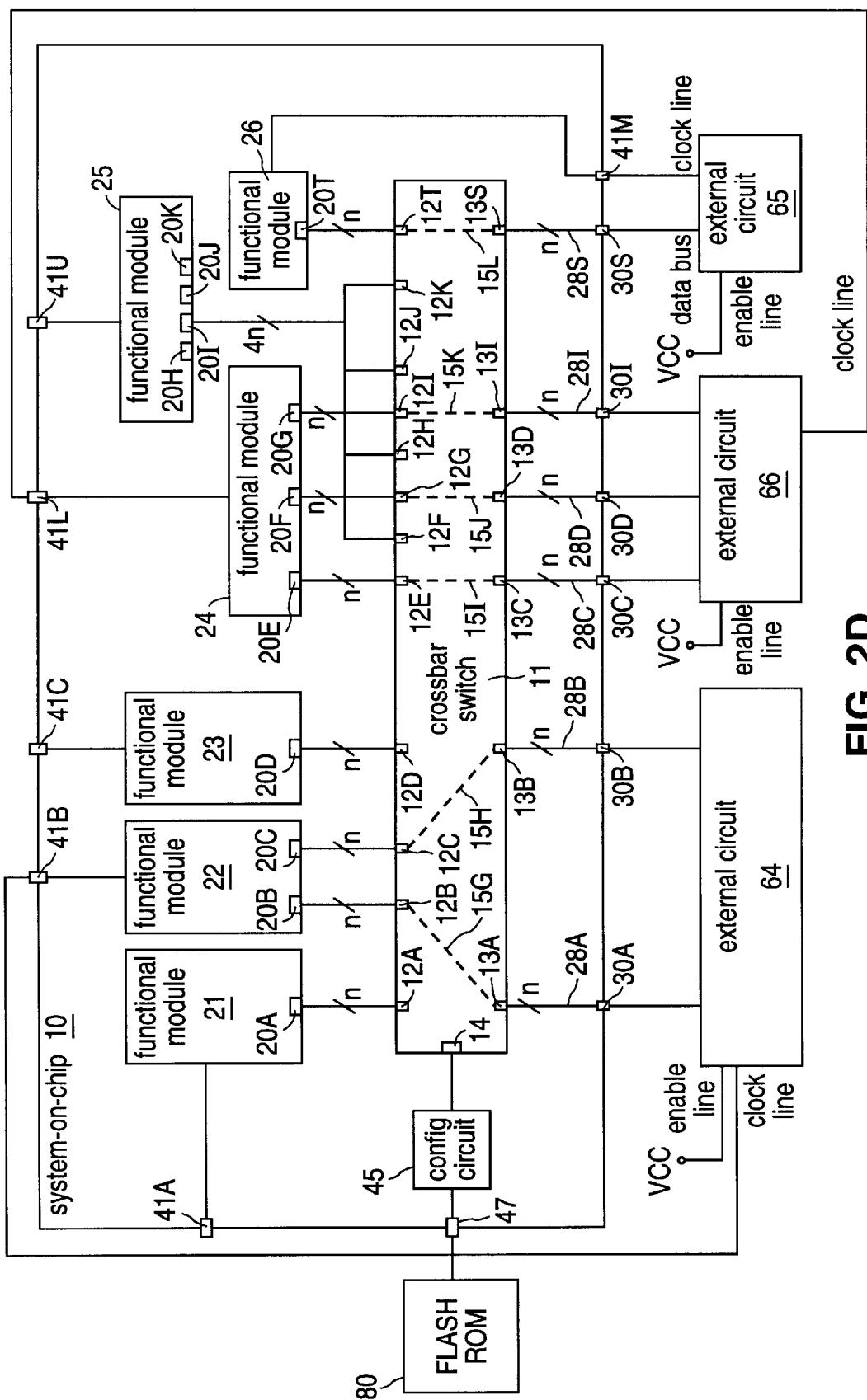
FIGS. 2D and 2E illustrate, in high-level block diagrams, alternative couplings within the switch of the system-on-chip of FIG. 2A for couplings to different external circuits.

In the example illustrated in FIG. 2A, functional module 25 communicates with external circuit 63 via default coupling 15A (e.g. by passing a test signal to group 30I of pads as illustrated by act 95 in FIG. 2C). In a similar manner, switch 11 forms default couplings 15B–15F from internal ports 12A, 12D, 12F, 12H, and 12K to respective external ports 13A–13D and 13S (see FIG. 2A), and such default couplings can be replaced by other couplings 15G–15J and 15L, depending on the result of the test in act 92.

In one implementation, config circuit 45 (FIG. 2B) is formed of two storage elements 45A and 45B that are respectively coupled to the two input ports of a multiplexer 45M. Multiplexer 45M in turn has a bus coupled to port 14 (described above), to supply thereto a signal from one of the two storage elements 45A and 45B. In the implementation illustrated in FIG. 2B, multiplexer 45M has a control line that carries the reset signal, and therefore during power up, multiplexer 45M passes a first control signal from storage element 45A to port 14, and after power up is completed passes a second control signal from storage element 45B. The two control signals can be updated in the respective storage elements 45A and 45B in any number of ways, e.g. from a bus 43 (described below) or from an external circuit (such as a flash ROM illustrated in FIG. 2D) that is coupled to port 47. Note that in other implementations, config circuit 45 can have a different number of storage elements or logic elements or both in some combination.

In the embodiment illustrated in FIG. 2A, each of buses 40A–40S of external circuits 61–63 does not carry address signals to distinguish among external circuits 61–63 (and hence buses 40A–40S are also referred to as "data" buses).

Chip 10 has additional pads, e.g. pads 41A–41U (wherein $A \leq L \leq U$, U being the total number of such pads) that carry control signals, such as a clock signal used by the external circuitry to latch data from a bus 40I. Although in the embodiment of FIG. 2A, pads 41A–41U that carry control signals are hardwired to the respective functional modules 21–26, such pads can be shared in other embodiments, in the manner described herein in reference to groups 30A–30S of pads.

Moreover, chip 10 has a port 42 (FIG. 2A) that carries address signals. Port 42 is coupled to an internal bus 43 that in turn is coupled to one or more of functional modules 21–25, thereby to allow such functional modules to be directly addressed by devices external to chip 10. Internal bus 43 is also coupled to config circuit 45 for the loading of storage elements 45A and 45B (FIG. 2B) as described above. Depending on the implementation, internal bus 43 can be similar or identical to the shared buses of the prior art (such as the address/data bus of Intel 8086 and Zilog Z8000 CPUs or Purcell's global bus as described above).

Note that one or more of modules 21–26 may have more than one data port, e.g. module 22 has two ports 20B and 20C, and module 25 has four ports 20H–20K. Also, one or more of external circuits 61–63 may have more than one data port, e.g. circuit 63 has four ports 40C–40S. Moreover, although chip 10 illustrated in FIGS. 2A, 2D and 2E has a single external circuit coupled to each functional module (e.g. circuits 61, 62 and 63 are respectively coupled to modules 21, 23, and 25), a single functional module can be coupled to multiple external circuits and vice versa, depending on the implementation. Therefore, a board designer can use the same chip 10 in different printed circuit boards to form different systems (that use different modules in chip 10).

Note also that, in one embodiment, functional modules 21–26 are formed without the programming of gate arrays (e.g. not by use of a field programmable gate array, abbreviated as "FPGA"). Instead, functional modules 21–26 are formed of a number of gates in the normal manner, during the fabrication of an integrated circuit (e.g. application specific integrated circuit, abbreviated as "ASIC").

Figure 2E:
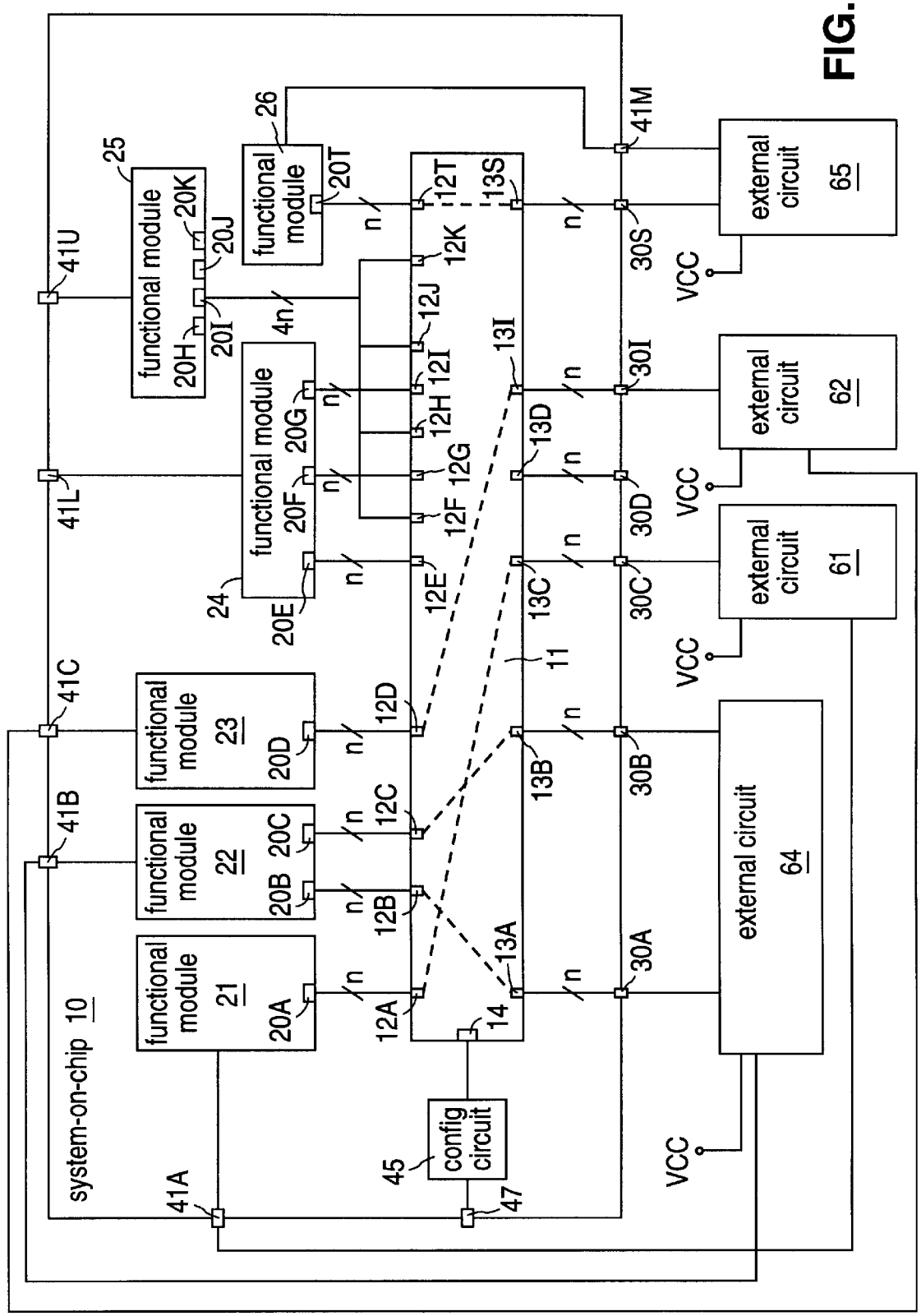

Although chip 10 is illustrated in FIG. 2A as being coupled to external circuits 61–63, the same chip 10 can be configured differently (by different flash ROMs of the type illustrated in FIG. 2D sending appropriately different signals to configuration circuit 45) for coupling functional modules 22 and 24 to external circuits 64–66 (FIG. 2D), or for coupling functional modules 21–23 to external circuits 61, 62, 64 and 65 (FIG. 2E). Moreover, a chip 10 that is used in one system can be reused in another system e.g. if one or more external circuits 61–66 are formed in a card 60 (FIG. 2A) that is detachably attached to the board (not shown) on which chip 10 is mounted. Card 60 can be, for example, a printed circuit board of the size of a credit card that is normally encapsulated and used interchangeably with other such cards, and can be attached to the board, e.g. via a PCMCIA connector of the type well known in the art.

Therefore, detaching card 60 from such a board decouples function modules 21, 23 and 25 (e.g. as illustrated by act 97 in FIG. 2C) from external circuits 61, 62 and 63 respectively. Thereafter, insertion of a second card (boundary not shown in FIG. 2D) couples function modules 22, 24 and 26 (e.g. as illustrated by act 99) to external circuits 64, 66 and 65 respectively. Such a second card may include a Flash ROM 80 (FIG. 2D) that supplies, when attached to chip 10, signals indicative of the couplings to be made between pads and functional modules of chip 10. Alternatively, such signals can be loaded from an internal bus 43 (inside chip 10) that is coupled to, for example, the central processing unit (CPU).

Note that in the just-described embodiment, couplings 15A–15F between internal ports 12A–12T and external ports 13A–13S are static couplings that are changed only during reset (as illustrated by an act 98 in FIG. 2C) that is performed e.g. by turning power off and on. For example, during reset, config circuit 45 is powered down and stops supplying configuration signals to switch 11, thereby to destroy previously used couplings 15A–15F (FIG. 2A). After power up, config circuit 45 (FIG. 2D) passes a second control signal to port 14, and in response switch 11 couples (see act 99 in FIG. 2C) external ports 13A and 13B to internal ports 12B and 12C (as illustrated by couplings 15G and 15H that are shown as dashed lines in FIG. 2D), thereby to allow functional module 22 to pass data signals (see act 102 in FIG. 2C) to external circuit 64.

About the same time, switch 11 also couples internal ports 12E, 12G, 12I and 12T respectively to the corresponding external ports 13C, 13D, 13I and 13S, thereby to allow the respective functional modules 24 and 26 to pass data to the corresponding external circuits 66 and 65. As noted above, couplings 15G–15L may be identified in, for example, FlashROM 80 of the second card. Note that pads in groups 30A–30S and 41M can be hard-wired to appear in the tri-state (floating), drive to zero, or drive to one state after hardware reset but before signals from FlashROM 80 have been downloaded.

As shown in FIGS. 2A, 2D and 2E, switch 11 includes only circuitry (FIG. 2B) sufficient for external function group 30A to be coupled to one of internal function groups 20A and 20B, and no others. Similarly, external function group 30B can be coupled to one of internal function groups 20C and 20D, and no others, while external function group 30C can be coupled to one of internal function groups 20A, 20E and 20H, and no others. Similarly, external function group 30D can be coupled only to one of internal function groups 20F and 20I, and no others. Hence, switch 11 has limited connectivity that is based on functionality of the various groups to which the respective ports are connected, unlike an FPGA (Field Programmable Gate Array) that has circuitry for coupling nearly any internal gate of the FPGA to any external I/O pin of the FPGA.

Depending on the implementation, immediately after power-up and during BIST, config circuit 45 indicates (see act 91 of FIG. 2C) to switch 11 default couplings 81 and 82 (also called "test" couplings; see FIG. 3) that interconnect the respective pairs of internal ports (12A, 12D) and (12B, 12C). Therefore, a signal generated at one internal port (e.g. port 12A that may be connected to a video output module) can be sampled by the other internal port (e.g. port 12D that may be connected to a video input module) to verify operability of the two ports (and switch 11).

Also, config circuit 45 can indicate to switch 11 additional test couplings (e.g. coupling 83 illustrated in FIG. 3) that interconnect two external ports (e.g. ports 13A and 13B), so that the external circuitry (e.g. circuits 61 and 62 that may be a video encoder and a video decoder respectively) can be tested via the two external ports. After such testing, config circuit 45 indicates to switch 11 dynamic couplings for use in normal operation of chip 10, as described above in reference to act 93 illustrated in FIG. 2C.

To avoid contention, all external circuits that are coupled to a common external function group are powered up as inputs, and only when an external circuit is enabled by config circuit 45 does that particular external circuit use the connected external function group. Such an external function group differs from a shared bus of the prior art because the signal carried by each pad of the external function group can be different depending on the external circuit that has been enabled (e.g. control signals can have different mappings), whereas in a shared bus the signal definition remains unchanged irrespective of the external circuit that uses the shared bus.

Note that optimization of the number of couplings (e.g. couplings 15A–15F) within switch 11 is generally application specific. Moreover, optimization of the controls (e.g., optimized MUX controls) of switch 11 provided by config circuit 45 is specific to a particular implementation of switch 11 (e.g., the number of configurable couplings). So, the system-on-chip as described herein provides a cost-effective and flexible implementation for coupling a number of modules of different functionality via limited groups of pads (also called "bond pads") to external circuitry.

Figure 4:
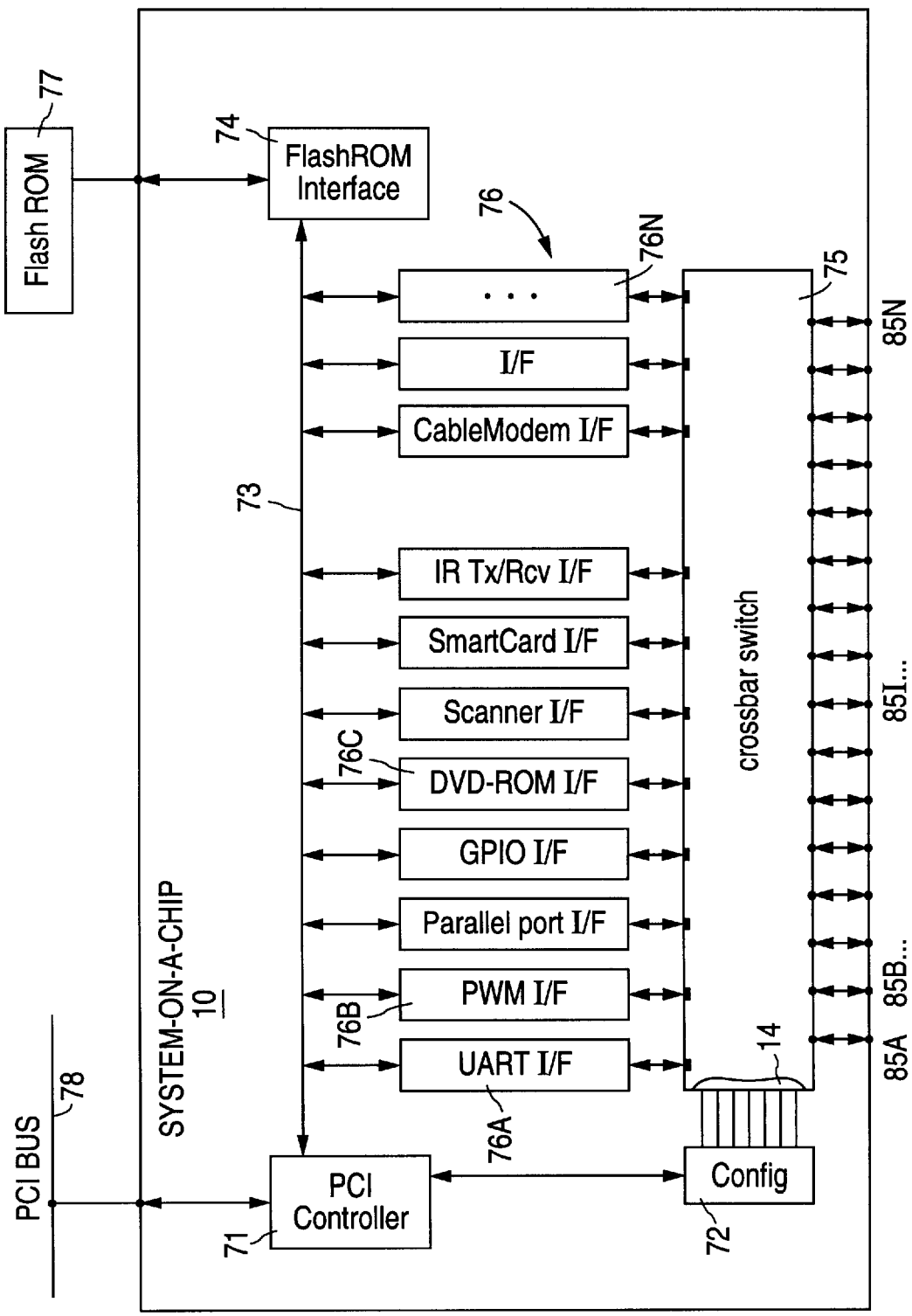
FIG. 4 illustrates, in a block diagram, specific examples of functional modules that may be included in a system-on-chip of the type illustrated in FIG. 2A.

In one embodiment, groups 85A–85N (illustrated in FIG. 4; wherein $A \leq I \leq N$, N being the total number of such groups) is a block diagram of configurable I/O (Input Output) pins connected to various modules of an SOC (System On Chip) 10 in one embodiment of the present invention. In particular, FIG. 4 shows groups 85A–85N connected to a crossbar switch 75 that implements limited connectivity as described above in reference to switch 15. Crossbar switch 75 is also connected to various modules 108 of functionality of SOC 10. For example, various modules 76A–76N include a UART (Universal synchronous/Asynchronous Receiver/Transmitter) module, a parallel port module, a GPIO (General Purpose Input Output) module, a DVD-ROM (Digital Versatile Disk-Read Only Memory) module, a scanner module, a Card module (e.g., a card is a credit card with a built-in microprocessor and memory that can be used as an identification card or financial transaction card), an IR Tx/Rcv (InfraRed Transmit/Receive) module and a Cable Modem module.

Crossbar switch 75 is also connected to a config (configuration) device 72. Config device 72 configures (reconfigures) crossbar switch 75 thereby configuring (reconfiguring) the connectivity of groups 85A–85N within chip 10. Config device 72 is connected to a PCI (Personal Computer Interface) controller 71. PCI controller 71 is connected to an internal bus 73 (e.g. the PCI bus standard well known in the art) and a Flash ROM (a Flash Read Only Memory) interface 74. In particular, Flash ROM interface 74 provides configuration data stored in a memory (e.g., a Flash ROM) of SOC 10 to config device 72 via bus 73 and bus controller 71. Config device 72 then configures crossbar switch 75 thereby configuring the couplings between groups 85A–85N and various modules 76A–76N.

Thus, groups 85A–85N can be configured to connect to the various system I/O functions of SOC 10. In one embodiment, groups 85A–85N can be statically configured (e.g., initialized upon power up) and optionally dynamically configured to connect to the various system I/O functions of SOC 10. In contrast, a typical SOC in the prior art provides pads that are hardwired to the respective function modules. The use of a crossbar switch 75 as described herein is particularly advantageous in integrated circuits that include various modules of functionality and a limited number of pads that are shared among various modules that can be used alternatively. Moreover, this approach advantageously allows for efficient use of the pads of an integrated circuit chip 10 and, thus, provides a cost-effective and flexible approach.

Figures 5, 5A:
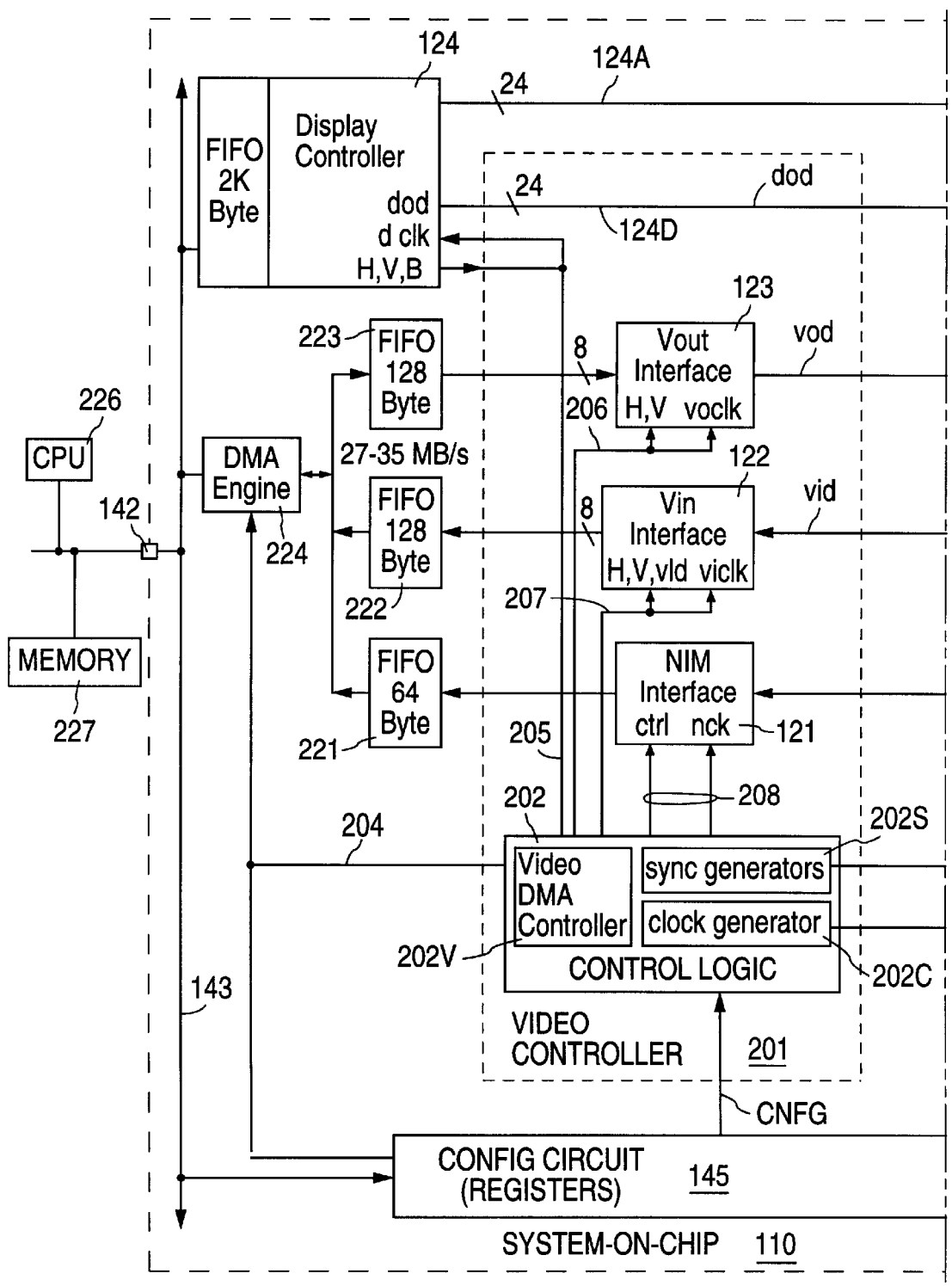
FIGS. 5A and 5B together illustrate (as shown by the key in FIG. 5), in a high-level block diagram, a video controller coupled to a switch for sharing of pads in one embodiment of the present invention.
Figure 5B:
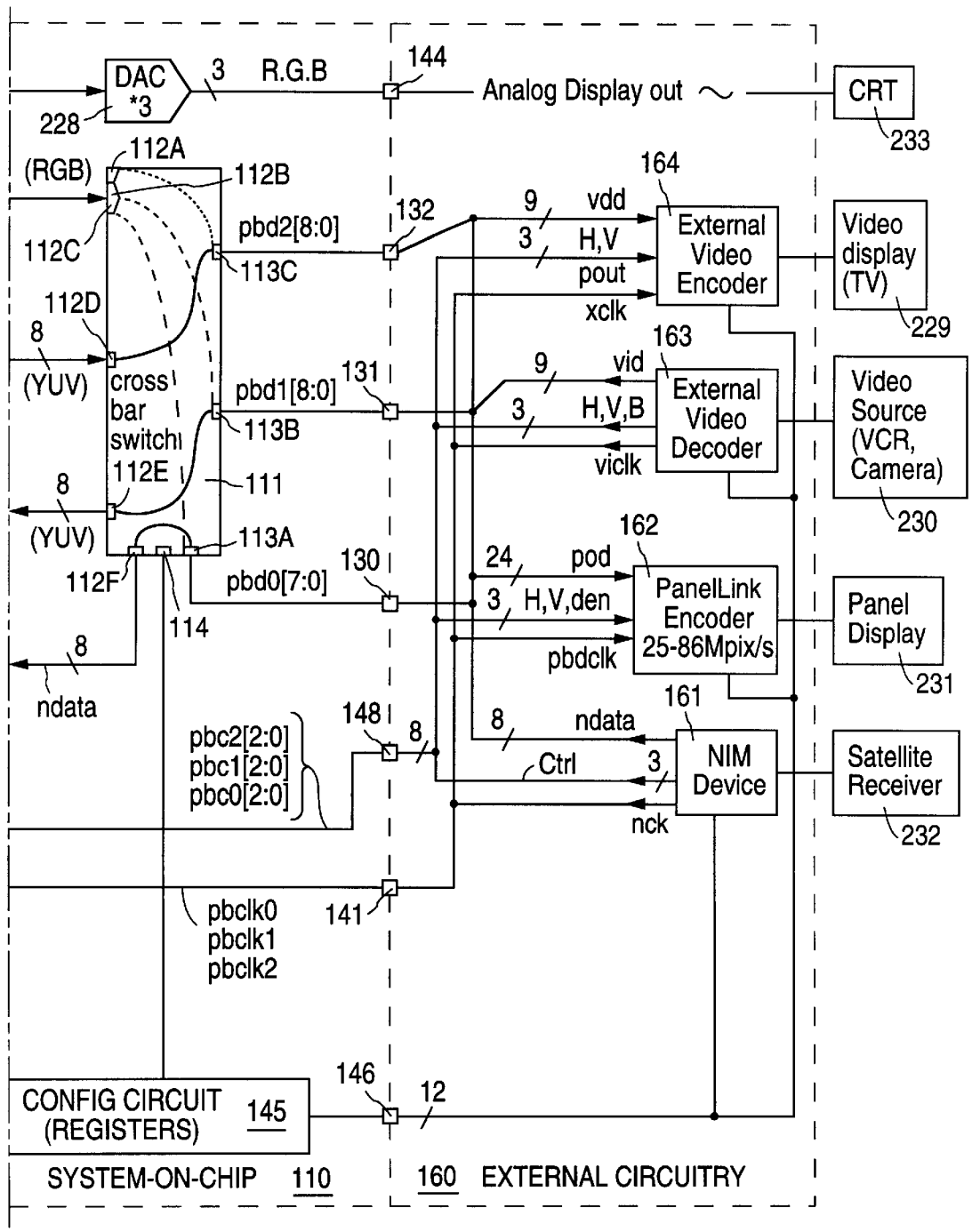

Note that the specific functions performed by the various external circuits and internal modules are not critical aspects of one embodiment of the invention. In one embodiment, a system on chip 110 (FIG. 5) includes a video controller 201 having video interface modules 122 and 123 for the receipt and transmission of data to and from video devices (such as a TV, a video camera or CRT), a network interface module 121 for receipt and transmission of data through a network (such as a satellite network), and a control logic 202 that controls operations of interface modules 121–123. Chip 110 also has a crossbar switch 111 for coupling modules in video controller 201 to groups 130–132 of pads of chip 110. Video controller 201 acts as a conduit for video data being transferred between various external devices 229–233 and a direct memory access "DMA" engine 224 (included in chip 110). In FIG. 5, several of the reference numerals are obtained by adding 100 to corresponding reference numerals that identify similar or identical circuitry in FIGS. 2A, 2B, 2D and 3 (described above).

Chip 110 of this embodiment also includes a display controller 124 that is coupled to crossbar switch 111, for dynamic coupling to one or more of external function groups 130–132 as an alternative to modules in video controller 201 (e.g. via dotted couplings in switch 111). Chip 110 further includes FIFOs 221–223 that are coupled to respective modules 121–123 for buffering the related data, and to DMA engine 224 for transfer of the data to and from a main memory 227 (outside chip 110), for use by a CPU 226 (also outside chip 110). CPU 226 controls the operation of control logic 202 by loading appropriate control signals in registers included in config circuit 145, and also controls crossbar switch 111 in a similar manner.

In one implementation, CPU 226 also controls devices 161–164 by writing values to registers in config circuit 145 that are permanently coupled to pads 146. The signals at pads 146 change at a rate that is slower than the rate at which CPU 226 can write values into the registers in config circuit 145 (e.g. such control signals may change at 100 kHz while the CPU operates at 100 MHz). In this specific implementation, the software being executed by CPU 226 conforms to an industry-standard protocol called "two-wire protocol" of the type described in a document entitled "MAXIM 2-wire Serial 8-Bit DACs with Rail-to-Rail Outputs" published by Maxim Integrated Products, 120 San Gabriel Drive, Sunnyvale, Calif. 94086, and available from, for example, www.maxim-ic.com or by calling 1-800-998-8800.

In addition to a 2-wire interface, pads 146 can include a pad for carrying a disable signal to each of devices 161–164, so that only selected groups of devices among devices 161–164 are enabled, as discussed below in reference to Table 3. Therefore, in this implementation, config circuit 145 consists of only storage elements, although in other embodiments and implementations, such a config circuit can include logic elements as well (for example to implement the above-described two-wire protocol). Note also that in other implementations, other protocols can be used, instead of the two-wire protocol.

In this specific embodiment, external function groups 130A–130C include a total of twenty-six pads 130–132 that can be connected by external circuitry 160 to one or more of external devices 229–233. These pads 130–132 are coupled by switch 111 to either display controller 124 or to modules 121–123, depending on the signals from config circuit 145. Display controller 124 is also connected by a DAC (Digital-to-Analog Converter) 228 via three pads 144 of chip 110 to an external graphics device, for example a CRT (cathode ray tube) 233. Note that pads 144 are permanently connected to DAC 228 in this specific embodiment. Therefore, two identical displays can be provided from display controller 124 to each of CRT 233 and panel display 231 (via dotted couplings in switch 111).

Figure 6A:
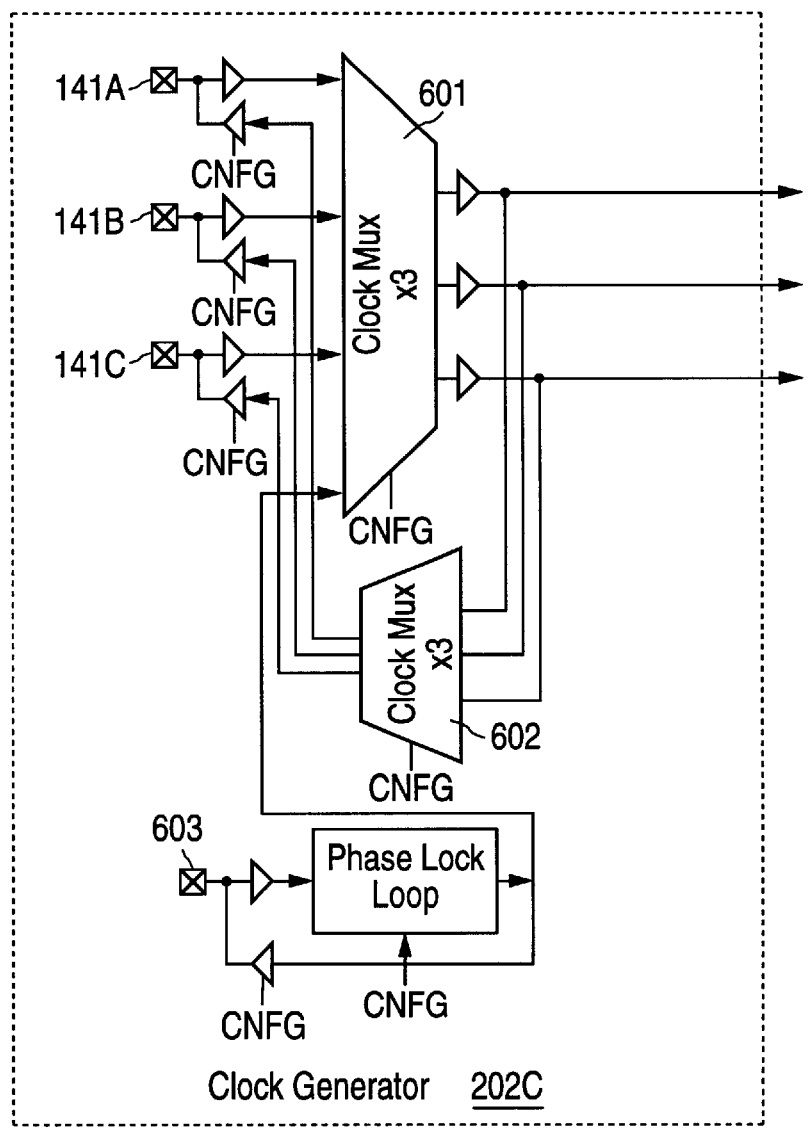
FIGS. 6A–6C illustrate, in low level block diagrams, a clock generator, a sync generator, and a video DMA controller included in control logic 202 of FIG. 5.

In addition, chip 10 includes a number of pads that are also permanently coupled to other internal modules, such as control logic 202 and config circuit 145. For example, pads in groups 141 and 148 respectively carry clock signals "pbclk0," "pbclk1," and "pbclk2" and various control signals "pbc0," "pbc1," and "pbc2" (that correspond to external signals such as horizontal synchronization signal "H," vertical synchronization signal "V", data enable signal "den," and blanking signal "B." Groups 141 and 148 are coupled to control logic 202 that includes various circuits such as a sync generator and clock generator that are described below in reference to FIGS. 6A and 6B. Another group 146 of pads are also permanently coupled to registers in config circuit 145.

Depending on the board design, chip 110 can be coupled to external circuitry 160 in the form of one or more of external video encoder 164, external video decoder 163, panel link encoder 162 (operating in the range of 25–86 Mpix/s) and NIM device 161. Examples include video encoder CH7005T (available from Chrontel, 2210 O'Toole Avenue, San Jose, Calif. 95131-1326, telephone (408) 383-9328, facsimile (408) 383-9338), video decoder SA7113H (available from Philips Electronics North America Headquarters, 1251 Avenue of the Americas, New York, N.Y. 10020-1104, telephone (212) 536-0500), panel link encoder SIL140 available from Silicon Image, Inc., 10131 Bubb Road, Cupertino, Calif. 95014, telephone (408) 873-3111 and NIM device ViSTA VES1993 available from VLSI Technology, Inc., 1109 McKay Drive, San Jose, Calif. 95131. Also, modules 121–123, control logic 202, DMA engine 224, and display controller 124 can be implemented by a person skilled in the design of video interfaces in the normal manner.

Switch 111 can be configured by CPU 226 to support any combinations of video devices 229–233 in which the total bus width is twenty-six or less. The clock signals can be selected as an input or output signal, and can be assigned to different blocks in video controller, display controller and the external devices. The registers in config circuit 145 control the bus width of the interfaces, flipping of the byte order, data and control bus configurations, and data bus mapping.

Video controller 201 acts as a communication link for video data between external video devices 229–232 and the DMA engine 224. As a secondary function, video controller 201 can also transfer graphics data from display controller 124 to external graphics devices 233. Such an external graphics device could include a Desktop-to-TV encoder and/or a Panel Link encoder for flatscreen display.

All external video/graphics devices 229–233 are connected to one or more of three sets of bi-directional data buses pbd0, pbd1 and pbd2, e.g. via pads in groups 130–132. Crossbar switch 111 implements connection of external devices 229–233 to internal interfaces 121–124. The data bus (also called "PBUS") is 9 bits wide for pbd1 and pbd2, and 8 bits wide for pbd0. As a result, the total data bus width of external devices is limited to 26 bits or less. Each of devices 229–233 is connected to control logic 202 via a three bit control bus which can be programmed to support control functions of different interfaces, such as Hsync, Vsync and Blank of a video interface, or Data_enable, Packet_error and Packet_sync signals of a NIM interface as described below (see Table 1).

In one implementation, control logic 202 includes a clock generator 202C and sync generators 202S that respectively transfer clock signals and synchronization signals among modules 121–123 and external devices 161–164. Specifically, clock generator 202C (FIG. 6A) includes three input multiplexers 601 and three output multiplexers 602 that are controlled by signals (called "CNFG") from config circuit 145 to provide any signal on any of pads 141A–141C to any other of pads 141A–141C. For example, a signal viclk interface module 122 receives video input from an external video decoder 163. The video playback interface module 123 transmits video output to an external video encoder 164. The NIM interface module 121 receives demodulated data from an external NIM device 161. The sync generator 202S supplies timing signals when any of video/graphics interface modules 121–123 is required to be the sync master. The video DMA controller 202V supplies all the device side DMA control signals for buffering the video I/O data, as well as all the device PIO register settings.

TABLE 1

PBUS external interface signals

| Name | Description | I/O | # of ports | Comments |
| --- | --- | --- | --- | --- |
| pbd2[8:0] | programmable parallel bus 2 data | I/O | 9 | Any combinations of multiple 8/16/18/24 bit data are supported. Total width of buses must be 26 bits or less. When connecting to bus 2 or 1, always use lower 8 bits for an 8 bits connection. |
| pbd1[8:0] | programmable parallel bus 1 data | I/O | 9 | |
| pbd0[7:0] | programmable parallel bus 0 data | I/O | 8 | |
| pbc2[2:0] | programmable parallel bus 2 control | I/O | 3 | Typically used for the control signals Hsync, Vsync, and Blank. |
| pbc2[2:0] | programmable parallel bus 1 control | I/O | 3 | |
| pbc2[2:0] | programmable parallel bus 0 control | I/O | 3 | |
| pbclk2 | programmable parallel bus 2 clock | I/O | 1 | |
| pbclk1 | programmable parallel bus 1 clock | I/O | 1 | |
| pbclk0 | programmable parallel bus 0 clock | I/O | 1 | | received at pad 141A is supplied to pad 141C when appropriate value is loaded into an appropriate register in config circuit 145. Moreover, clock generator 202C also receives at an internal terminal 603 an internal clock signal that can be supplied to any of pads 141A–141 C. Therefore, such an internal clock signal can be supplied to one or more of external devices 161–164, for example, to ensure synchronization between two displays on devices 231 and 233 (and also, for example, to view "picture-in-picture," wherein one picture is from a computer display and another from a television display).

Figure 6B:
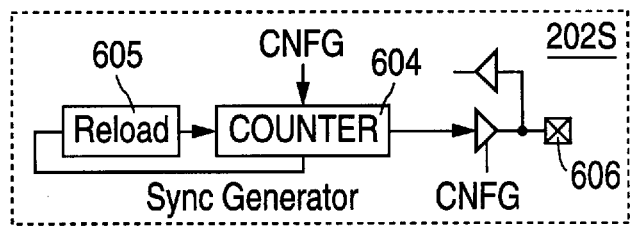

Similarly, in this implementation, a total of nine sync generators 202S (only one of which is illustrated in FIG. 6B) generate timing signals indicated by CPU 226 (by appropriate loading of the registers in config circuit 145). Specifically, a value from config circuit 145 is loaded into counter 604 that counts down from the loaded value at the rate of an internal clock signal (described above in reference to terminal 603). A reload circuit 605 inside sync generator 202S compares the current value in counter 604 with zero, and when these values are equal, reload circuit 605 causes counter 604 to be reloaded from config circuit 145. Depending on the bit being supplied to a pad 606 (that can be one of pads 148 described above in reference to FIG. 5), the generated signal has different values at different times (wherein frequency of the pulse being supplied depends on the bit position as well as on the loaded value). In this implementation, reload circuit 604 can be, for example, a comparator against zero value.

Video controller 201 also contains a number of interface modules to facilitate glueless connection to external video/graphics devices 229–233. Specifically, the video capture As noted above, crossbar switch 111 (also called "programmable parallel buses") transfers data between external video/graphics devices 161–164 and internal video/graphics interfaces 121–124. The progranunable parallel buses can be configured to support any combinations of video devices where the total bus width is 26 or less. A number of loopback modes are also supported for test purpose. The clock signals can be selected as an input or output signal, and can be assigned to different modules in the video controller 201, the display controller 124 and external devices 161–164. The flexible clock selections allow a number of device synchronizations between video/graphics devices 229–233. Refer to Table 15 and the related description for details of clock selection options.

The registers in config circuit 145 control the bus width of the interfaces, flipping of the byte order, data and control bus configurations, and data bus mapping. Each module in video controller 201 can receive data from one of the PBUS inputs 112A–112F, and each PBUS output 113A–113C can transmit data from one of these modules. While assignment of the control bus pbc2[2:0], pbc1[2:0] and pbc0[2:0] are fully programmable, the mapping of data sources pbd0[7:0], pbd1[8:0] and pbd2[8:0] is somewhat limited, i.e., not every byte of data can be read from or write to any data bus. The following Table 2 show the possible mapping between the PBUS data and external devices. Note that in Table 2, the same color bits R[2], R[7:3] and G[7:5] are assigned to byte lane 0, PBD2[8:0] irrespective of the data format being Panellink 24-bit or 18-bit, thereby to avoid change of wiring on the board when changing between these two formats. Note that three least significant bits (LSB) or red and blue and two LSB of green are sacrificed when using 18-bit Panellink data format.

TABLE 2

PBUS data mapping

| Data Format | PBD2[8:0] | PBD1[8:0] | PBD0[7:0] | PBUS I/O | Control Settings |
|---|---|---|---|---|---|
| PanelLink 24-bit | R[2],R[7:3],G[7:5] | B[2],G[4:2],B[7:3] | R[2:0],G[1:0],B[2:0] | O | PBD{2,1,0}CFG = 3 |
| PanelLink 18-bit | R[2],R[7:3],G[7:5] | B[2],G[4:2],B[7:3] | X | O | PBD{2,1}CFG = 3 |
| Desktop to TV 16-bit | G[4:2],B[7:3] | R[7:3],G[7:5] | X | O | PBD{2,1}CFG = 2<br>DTTVW = 0 |
| Desktop to TV 16-bit | X | R[7:3],G[7:5] | G(4:2],B[7:3] | O | PBD{1,0}CFG = 2<br>DTTVW = 0 |
| Desktop to TV 8-bit | G[4:2],B[7:3] \| R[7:3],G[7:5] | X | X | O | PBD2CFG = 2<br>DTTVW = 1 |
| Desktop to TV 8-bit | X | X | G[4:2],B[7:3] \| R[7:3],G[7:5] | O | PBD0CFG = 2<br>DTTVW = 1 |
| Video Playback 16-bit | VOD[7:0] | VOD[15:8] | X | O | PBD{2,1}CFG = 1 |
| Video Playback 16-bit | X | VOD[15:8] | VOD[7:0] | O | PBD{1,0}CFG = 1 |
| Video Playback 8-bit | VOD[15:8] \| VOD[7:0] | X | X | O | PBD2CFG = 1 |
| Video Playback 8-bit | X | X | VOD[15:8] \| VOD[7:0] | O | PBD0CFG = 1 |
| Video Capture | X | X | VID_Y[7:0] \| VID_C[7:0] | I | PBD0CFG = 0<br>VIALT = 0 |
| Video Capture | VID_Y[7:0] VID_C[7:0] | X | X | I | PBD2CFG = 0<br>VIALT = 1 |
| NIM | X | X | NIMD[7:0] | I | PBD0CFG = 0<br>NIMALT = 0 |
| NIM | X | NIMD[7:0] | X | I | PBD1CFG = 0<br>NIMALT = 1 |

In the above Table 2, the right-most column indicates the values being loaded in various registers in config circuit 145. For example, to use byte lane 2 for video capture and byte lane 0 for video playback, bit PBD2CFG is set 0 and bits PBD0CFG and VIALT are set 1. Given he mapping in Table 2, the possible combinations of video devices that can operate simultaneously with chip 110 (FIG. 5) are shown below in Table 3.

TABLE 3

Video/graphics devices combination

|  | PanelLink-18 | DTTV-16 | DTTV-8 | Video Out-16 | Video Out-8 | Video In | NIM |
|---|---|---|---|---|---|---|---|
| PanelLink-24 |  |  |  |  |  |  |  |
| PanelLink-18 |  |  | $ |  | $ | $ | $ |
| DTTV-16 |  |  |  |  |  | $ | $ |
| DTTV-8 | $ |  |  |  |  | $ | $ |
| Video Out-16 |  |  |  |  |  | $ | $ |
| Video Out-8 | $ |  |  |  |  | $ | $ |
| Video In | $ | $ | $ | $ | $ |  | $ |
| NIM | $ | $ | $ | $ | $ | $ |  |

Note that in the above Table 3, "$" marks all legal combination of two video/graphics devices. The two possible combination of three video devices are: 8-bit video in, 8 bit video out and 8 bit NIM; or 8-bit video in, 8 bit desktop to TV out and 8 bit NIM Loopback modes can be accomplished by enabling an input device and output device on the same parallel bus. The FIFO depth of video in and video out interfaces supports CCIR601 4:2:2 data rate, i.e., ~27 Mbyte/s. In the example illustrated in FIG. 5, de-interlaced or high bandwidth digital video formats are not supported. The FIFO depth of display controller 124 supports up to 250 MHz 24bit RGB data. Sync generator 202S generates a Hsync output signal with programmable pulse width, and a Vsync output signal with a fixed pulse width of 2 lines. In Table 2, bit DTTVW changes the clock rate to the display controller 124 between 1X and 2X pixel rate. This bit is set during system start up and is not changed on the fly.

In one example illustrated in FIG. 5, various signals to and from module 122 are described in Table 4 below.

TABLE 4

Video capture interface to PBUS

| Name | Description | I/O | # of ports | PBUS connection |
|---|---|---|---|---|
| vihs | horizontal sync input | I | 1 | pbc{2,1,0}[2] |
| vivs | vertical sync or field input | I | 1 | pbc{2,1,0}[1] |
| vidvld | data valid flag input. Brooktree DVALID support | I | 1 | pbc{2,1,0}[0] |
| viclk | clock input | I | 1 | pbclk{2,1,0} |
| vid[7:0] | video data input. Only 8 bit interface is supported. | I | 8 | pbd{2,1,0}[7:0] |

Supported video decoders for use with module 122 include Philips SAA7111A, Samsung KS0122, Samsung KS0127, Brooktree BT817/BT819 and Brooktree BT827/

BT829. The video capture interface module 122 transfers data from an external video decoder 163 to the main memory 227. The DMA engine 224, in combination with an IOS-RAM buffers the data transfer between the external device and main memory.

Data is unpacked into bytes in all DMA data transfers. The order of the byte is shown below in Table 5. Video control registers in config circuit 145 specify vertical and horizontal trigger modes, vertical and horizontal delays, vertical active field size, and active pixels per line. The values in registers of config circuit 145 are set up before video capture is enabled. After video is enabled, the video input logic will sync up to the next odd field start (if odd fields are disabled the video logic 122 will sync to the next even field start). When CCIR656 mode is enabled, input sync signals are ignored by module 122. Sync information is extracted from the data stream. Video capture module 122 generates the following maskable interrupts: odd field start interrupt, based on vertical sync, odd field end interrupt, based on VIFSIZE lines, even field start interrupt, based on vertical sync, even field end interrupt, based on VIFSIZE lines and scan line count interrupt.

TABLE 5

Video Capture Interface Data Format

| Pixel 3 | | Pixel 2 | | Pixel 1 | | Pixel 0 | |
|---|---|---|---|---|---|---|---|
| Byte 7 | Byte 6 | Byte 5 | Byte 4 | Byte 3 | Byte 2 | Byte 1 | Byte 0 |
| y3 | cr2 | y2 | cb2 | y1 | cr0 | y0 | cb0 |

DMA data transfers always operate in units of whole 32 byte cache lines. The DMA engine 224 has no provision for skipping data of cache lines nor bytes within a cache line. The video capture interface module 122 transfers data in bytes. The VILSIZE parameter defines how many pixels to capture per video line. As a result, video data can be organized in one of two fashions. VILSIZE can be set to multiples of 16, such that the line size is multiple of cache line size. Alternatively, VILSIZE can be set to the exact pixel count of the line size. In this case, beginning of line may start anywhere within a cache line. VIRSIZE can be programmed to fill up the remainder of the last cache line of a frame. Comparing to MPACT video interface, 1 cycle is added to horizontal delay. Zero delay case is pushed back 1 cycle. The zero delay case was important for zoom video interface, which is not supported. Only 1 reg for remainder pixels at end of frame. Even and odd active lines count is assumed to be the same.

In one example illustrated in FIG. 5, various signals from and to module 123 are described in Table 6 below.

TABLE 6

Video playback interface to PBUS

| Name | Description | I/O | # of ports | PBUS connection |
|---|---|---|---|---|
| vohs | horizontal sync input | I | 1 | pbc{2,1,0}[2] |
| vovs | vertical sync or field input | I | 1 | pbc{2,1,0}[1] |
| voclk | video playback clock. | I | 1 | pbclk{2,1,0} |
| vod[7:0] | video data output. Only 8 bit interface is supported. | O | 8 | pbd{2,1,0}[7:0] |

Supported video encoders for use with module 123 include Brooktree BT868/BT869, Chrontel CH7004, Philips SAA7187A, Philips SAA7124/7125, Analog Devices ADV7176, Analog Devices ADV7175, Brooktree BT852, Brooktree BT866.

The video playback interface module 123 transfers data from main memory 227 to an external video encoder 164. The DMA engine 224, in combination with the IOSRAM buffers the data transfer between the external device and main memory.

Full screen video data is stored in memory 227 in YCrCb 4:2:2 format. Table 7 below shows the byte order of data transfer. Registers in config circuit 145 specify video playback clock source, Hsync and Vsync source, video source, vertical and horizontal trigger codes, vertical and horizontal delays, vertical active field size, and active pixels per line. Again, the values in config circuit 145 are set up before video playback is enabled, and after the video encoder 164 is configured. After video is enabled, the video output logic 123 will sync up to the start of the next odd field (if odd field are disabled the video logic will sync to the start of the next even field).

Video playback module 123 generates the following maskable interrupts: odd field start interrupt, based on vertical sync, odd field end interrupt, based on VOFSIZE lines after vs, even field start interrupt, based on vertical sync, even field end interrupt, based on VOFSIZE lines after vs, line count interrupt, every N active lines.

TABLE 7

Video Playback Interface Data Format

| Pixel 3 | | Pixel 2 | | Pixel 1 | | Pixel 0 | |
|---|---|---|---|---|---|---|---|
| Byte 7 | Byte 6 | Byte 5 | Byte 4 | Byte 3 | Byte 2 | Byte 1 | Byte 0 |
| y3 | cr2 | y2 | cb2 | y1 | cr0 | y0 | cb0 |

DMA data transfers always operate in units of whole 32 byte cache lines. The DMA engine 224 has no provision for skipping data of cache lines nor bytes within a cache line. The video playback interface module 123 requires a horizontal sync to identify the start of a new video scan line. After a horizontal sync, the video playback logic counts down the VOHDLY value. When the VOHDLY counter underflows, the video playback FIFO is activated for the duration of active video. The video playback interface module 123 transfers data in bytes. The VOLSIZE parameter defines how many pixels to playback per video line. As a result, video data can be organized in one of two fashions. VOLSIZE can be set to multiples of 16, such that the line size is multiple of cache line size. Alternatively, VOLSIZE can be set to the exact pixel count of the line size. In this case, beginning of line may start anywhere within a cache line. VORSIZE can be programmed to fill up the remainder of the last cache line of a frame. Video playback interface module 123 slaves to either the display PLL clock, external encoder clock, or external decoder clock. By sharing the same clock, video playback module 123 can be synchronized to the external encoder 164, external decoder 163 or the display controller 124. Chrontel CH7004 only supports sync slave mode in interlace video (Hsync, Vsync output from system-on-chip 111 to CH7004). Sync signals can be supported in CCIR656 format (embedded sync), or via sync signals. The example illustrated in FIG. 5 provides no hardware support for video to audio synchronization and video to NIM synchronization.

Figure 6C:
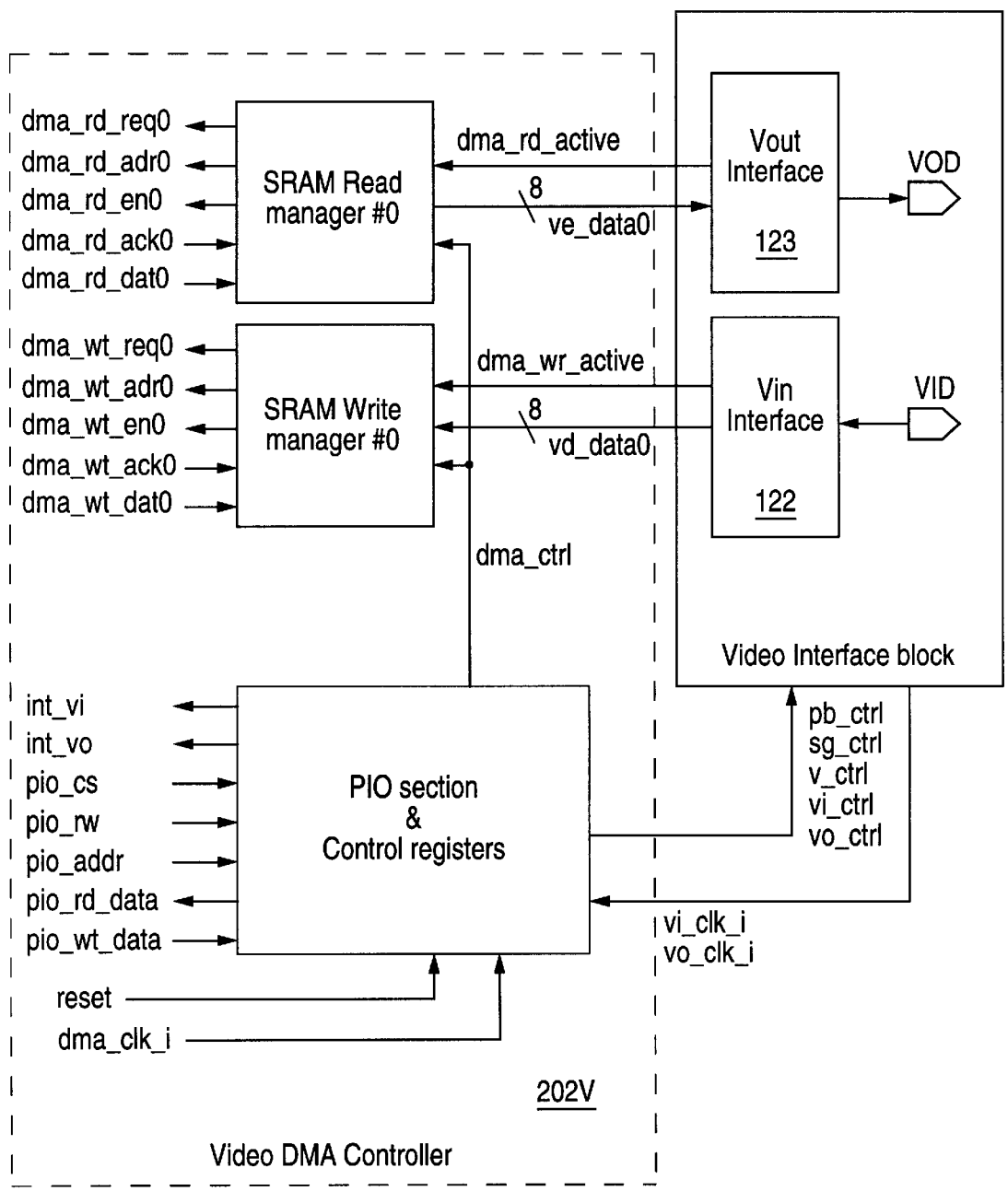

In one example illustrated in FIG. 6, various signals from and to display controller 124 are described in Table 8 below.

TABLE 8

Display Controller to PBUS interface

| Name | Description | I/O | # of ports | PBUS connection |
|---|---|---|---|---|
| dchs | horizontal sync output | O | 1 | pbc{2,1,0}[2] |
| dcvs | vertical sync or field output | O | 1 | pbc{2,1,0}[1] |
| dcbk | blank/data enable flag output. Silicon Image Sil140, 150 panellink requirement | O | 1 | pbc{2,1,0}[0] |
| dclk | display pixel clock. | I | 1 | pbclk{2,1,0} |
| dod[23:0] | Pixel data. Data is organized in {R[7:0], G[7:0],B[7:0]} order. Graphics data can be transmitted to a PanelLink encoder, or a Desktop to TV encoder. | O | 24 | pbd{2,1,0}[7:0] |

Supported encoders for use with display controller 124 include Silicon Image Sil140, Silicon Image Sil150, and Chrontel CH7004.

The display controller 124 transfers data to an external video encoder 164 with desktop to TV support or a panellink encoder 162. Display controller 124 outputs graphics data in RGB 8-8-8 format. The video encoder 164 can accept data in RGB 5-6-5 format. The panellink encoder 162 can accept data in 18 bit RGB 6-6-6 or 24 bit RGB 8-8-8 format. The PBUS connection 132 to an external video encoder 164 can be configured to transmit data in 8-bit or 16-bit quantities. When an 8-bit interface is selected, the interface operates at 2X pixel clock rate to transmit 16-bit pixel data.

The PBUS connections 130–132 to an external panellink encoder 162 can be configured to transmit data in 18-bit or 24-bit quantities. Panellink data is always transmitted at 1pixel per clock. In 18-bit RGB 6-6-6 data format, the 2 LSBs are truncated. All video sync timing, sync signals and data alignments are generated by the list processor in the display controller. Registers in config circuit 145 contain an enable bit for the 24 bit data bus. The data bus should be disabled when the display controller is sending out high speed monitor data to the RAMDACs.

In general the display controller data bus 124D (FIG. 5) should be enabled after the external encoder 162 is configured. In order to support soft switching between 18-bit panellink data plus an 8-bit video device, and 24-bit panellink data mode, 2 extra bits are provided on the programmable parallel buses. In the example illustrated in FIG. 5, no video playback FIFO to panellink interface out is supported. When display controller 124 is driving a combination of monitor 233 and panellink display 231, only one set of Hsync, Vsync and Blank/Den control signals are generated by the display controller 124. If the control signal formnat is incompatible, the number of simultaneous output devices may be limited. When video is output from display controller 124 to monitor 233 and video encoder 164 simultaneously, video encoder 164 is the clock master, display controller 124 is the Hsync and Vsync master. Only one set of Vsync and Hsync signals are generated to be used between the monitor 233 and video encoder 164. If sync for monitor 233 is not suitable for the video encoder 164, CCIR656 embedded sync may be used.

In one example illustrated in FIG. 5, various signals to and from NIM interface module 121 are described below in reference to Table 9.

TABLE 9

NIM to PBUS interface

| Name | Description | I/O | # of ports | PBUS connection |
|---|---|---|---|---|
| nden | NIM data enable | I | 1 | pbc{2,1,0}[2] |
| nuncor | NIM uncorrectable packet error | I | 1 | pbc{2,1,0}[1] |
| npsync | NIM packet sync | I | 1 | pbc(2,1,0)[0] |
| nck | NIM clock input | I | 1 | pbclk{2,1,0} |
| ndata[7:0] | NIM data after demodulation and de-interleaving | I | 8 | pbd{2,1,0}[7:0] |

The NIM interface module 121 transfers data from the NIM port 130 to a slow DMA channel via FIFO 221. For test purposes, sync generator 202S can supply all the control signals for a loopback test, as shown in Table 10 below.

TABLE 10

Sync generator 202S to PBUS interface

| Name | Description | I/O | # of ports | PBUS connection |
|---|---|---|---|---|
| sghs | horizontal sync output hs or href or nden | O | 1 | pbc{2,1,0}[2] |
| sgvs | vertical sync output vs or field or nuncor | O | 1 | pbc{2,1,0}[1] |
| sgps | NIM packet sync output npsync | O | 1 | pbc{2,1,0}[0] |
| sgclk | clock input | O | 1 | pbclk{2,1,0} |

The sync generator 202S generates three programmable timing signals. The output signals can be configured to drive Hsync, Vsync and Blank signal of a video interface, or the data enable, packet error, and packet sync signals of a NIM interface module 121. The sync generator 202S allows the video out interface 123 to run in sync master mode (Brooktree Bt868 and the Chrontel CH7004 video encoders operates only as a sync slave in interlace video). It also allow video in, video out and NIM interface modules 121–123 to be tested in loopback mode.

Sync generator 202S registers specify total horizontal width, Hsync pulse width, total vertical height in odd and even fields, Hsync and Vsync level inversion, and Vsync input and output modes. In general the parameters should be set up before the sync generator 202S is enabled. After generator 202S is enabled, the first Hsync is generated after 1 full line and the first Vsync is generated on the next line. When disabled, the last field will always run to completion. Hsync pulse width is programmable to any voclk width. In Brooktree Vsync mode (SGVSMODE=0), Vsync pulses width varies between 1 line for odd field and 2 lines for even fields. Program SGVSMODE=SGOVTOT=SGEVTOT=0 to keep NIM packet error pin low. Program SGVSMODE=1 to toggle NIM packet error pin. Normally, field line count= n+1 in SGOVTOT and SGEVTOT. In SGVSMODE=0, Odd field line count=SGOVTOT and even field line count= SGEVTOT+2.

The following Tables 11–14 describe signals to and from video DMA controller 202V.

TABLE 11

PIO sector

| Name | Description | I/O | # of ports | Comments |
|---|---|---|---|---|
| pio_cs | pio controller select | I | 1 | |
| pio_rw | pio_read/write selection | I | 1 | |
| pio_addr | PIO read/write address | I | 5 | |
| pio_rd_data | PIO data output port for read | O | 8 | |
| pio_wt_data | PIO data input port for write | I | 8 | |

TABLE 12

Incoming DMA sector

| Name | Description | I/O | # of ports | Comments |
|---|---|---|---|---|
| dma_wt_dat0 | video decoder data #0 | O | 8 | |
| dma_wt_adr0 | SRAM address for dma_wt_dat0 | O | 6 | |
| dma_wt_req0 | Request for dma_wt_dat0 | O | 1 | |
| dma_wt_ack0 | Acknowledge for dma_wt_dat0 | I | 1 | @ DMA clock |
| dma_wt_en0 | SRAM write enable #0 | O | 1 | |

TABLE 13

Outgoing DMA sector

| Name | Description | I/O | # of ports | Comments |
|---|---|---|---|---|
| dma_rd_dat0 | video encoder 164 data #0 | I | 8 | |
| dma_rd_adr0 | SRAM address for dma_rd_dat0 | O | 6 | |
| dma_rd_req0 | Request signal for dma_rd_dat0 | O | 1 | |
| dma_rd_ack0 | Acknowledge for dma_rd_dat0 | I | 1 | @ DMA clock |
| dma_rd_en0 | SRAM read enable #0 | O | 1 | |

TABLE 14

Miscellaneous signals

| Name | Description | I/O | # of ports | Comments |
|---|---|---|---|---|
| int_vi | video in interrupt signal | O | 1 | |
| int_vo | video out interrupt signal | O | 1 | |
| reset | controller H/W reset | I | 1 | |
| dma_clk_i | DMA clock in | I | 1 | |

The video DMA controller 202V (FIG. 6C) manages the DMA data transfers to and from the DMA engine 224, as well as the PIO register setting of all the video interface modules 122 and 123. Video data transfer between main memory 227 and the external devices 229–233 are buffered by an IOSRAM FIFO. The device side of DMA controller 202V generates the request and address signals of FIFO control. When DMA bandwidth is available, DMA engine 224 acknowledge the pending request and data is transferred. All FIFO interactions are managed by hardware. Once a DMA channel is enable, the device and engine sides of DMA controller 202V will automatically try to fill an output FIFO and empty an input FIFO. Examples of DMA settings under software control are: DMA sector registers (valid bit, terminal count, and starting address), DMA engine interrupt and enable registers (DMA engine channel enable, sector completion interrupt, and sector invalid interrupt), and Video DMA control (vdmarden, vdmawren, vdmawrorun, and vdmardurun).

DMA data are transferred between IOSRAM and video controller 202V only during active video. Active video is identified by the dma_wt_active signal during capture and the dma_rd_active during playback. The basic function and protocols of DMA/PIO interface are the same as other I/O blocks.

Upon reset, all the control and status registers are brought into their default value 0, promoting controller 202 and codec to the well-defined default state. The default state concerning the controller sector is specified as: all DMA channels inactive and in composite mode, all interrupt sources cleared and disabled, no loopback, all SRAM addresses pointing 6b000000, PLL power-down. Note that in the preceding sentence "6b" means "the following six bits."

Other registers in config circuit 145 (invisible from outside) are also reset to 0 (with one exception that state machines reset to 4b0001, IDLE state). This may give rise to a potential side-effects of DMA protocol violation, i.e. fake request signal in DMA interface. If the channel is disabled in DMA engine (i.e. the corresponding bit in DMA_EN register is 0) this fake request is simply ignored and harmless.

SRAM Write manager (not labeled; see FIG. 6C) halts DMA transfer as immediately as possible after the DMA start bit is de-asserted. More precisely, on the next positive edge after the manager sees the register bit dma_ctrl0[1|0] becomes 0, the manager gets back to IDLE state. This means that in the last cycle, SRAM write may take place even if the bit is 0.

DMA stop is distinguished from reset by the following points: SRAM pointer retains its last-accessed address, internal buffers hold their last values (invisible from outside), DMA request keeps its level (unless DMA stop eventually coincides with request timing. It should be noted that the transfer cannot be continued from the point where it was halted. As SRAM address pointer is reset to 6h00 in INIT state, it always re-start from the beginning.

SRAM Read manager (not labeled; see FIG. 6C) halts DMA transfer as immediately as possible after the DMA start bit is de-asserted. More precisely, in the next positive edge after the register bit dma_ctrl0[3|2] becomes 0, the manager gets back to IDLE state. Data corresponding to SRAM enables asserted in the last three cycles arrive at dma_rd_dat port after de-assertion of DMA start bit, but the manager ignores these data. The situations for SRAM pointers, internal (output) buffers, request level for incoming DMA after stop equally apply to those of outgoing DMA.

Figure 7A:
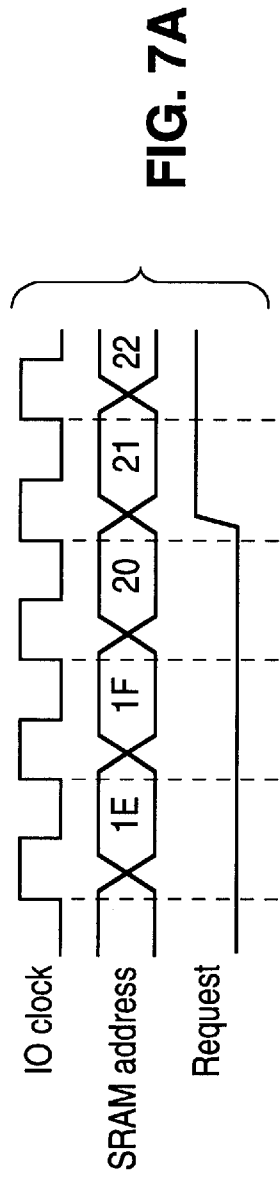
FIGS. 7A and 7B illustrate, in timing diagrams, various signals generated by the DMA controller of FIG. 6C.

Note that the SRAM pointer value held after stop is that associated to the last SRAM enable, not to the last-captured data. SRAM Read/Write manager signals request every time its SRAM address pointers crosses the I/O SRAM bank boundary. Precisely, the request signal takes place on the positive edge of the clock after the first enable/address/data for the next bank are pushed out on the buses. See FIG. 7A for an example for S-video mode.

If the acknowledge corresponding the previous request has not been detected by this cycle, io_int (in IO_CLK domain) is asserted at the same timing as the request signal. This io_int propagates to DMA_CLK domain at the next positive edge of the DMA_CLK and interrupt signal is asserted. Note that the acknowledge detected at the first cycle of the next bank (0x20 in the figure) can override the interrupt. This will help allowing DMA engine 224 a maximum response time. The controller 202V does not stop the DMA transfer by itself even when overrun/underrun error occurs. It keeps going on processing until it is explicitly instructed to stop the transfer.

Figure 7B:
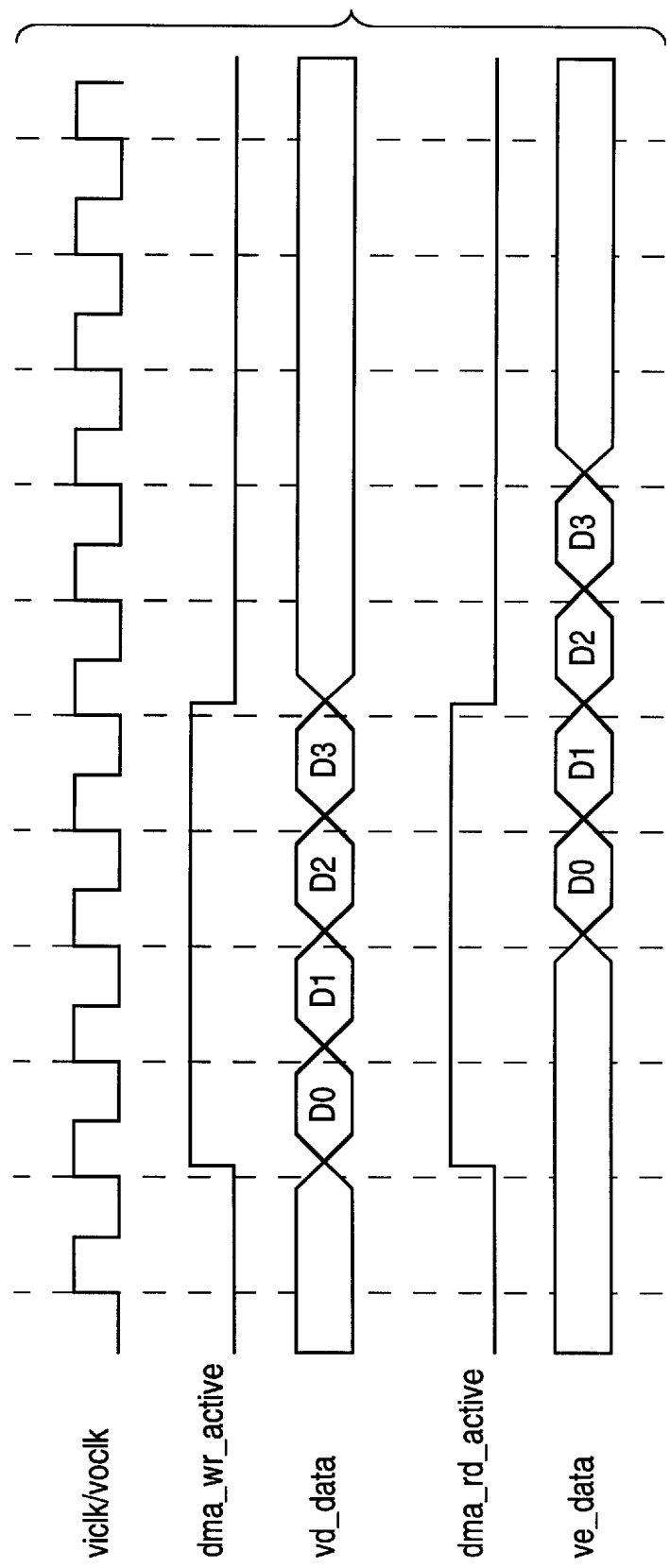

After video input channel is enabled, data can be written to IOSRAM immediately. When active video is present, dma_wr_active is set to 1, and data is transferred from video capture interface to IOSRAM. After video output channel is enabled, IOSRAM may not be ready for a period of time. The vo_sram_ready signal will keep video playback state machine in reset until IOSRAM is ready to read and vo_sram_ready bit is set. When active video is transmitted, dma_rd_active is set to 1, and data is transferred from IOSRAM to video playback interface. The timing relationship between the active signals and data is illustrated in FIG. 7B.

Multiple loop back modes are provided in the video controller block to facilitate testing. All loopback modes are supported by driving to and reading from the same PBUS. Besides the normal DFT test supports for all the digital designs, the video controller also provide test features to allow testing of the analog display DACs, and force clocks to be running during scan testing.

When analog test mode is enabled, PBUS 0 can be used to drive DAC input directly. Refer to the Analog Test Strategy section of the Test and Debug Specification for details of the options. When scan test is enabled (tcb_xx_testenb) all clock mux control are forced to select display PLL clock, or external clock pbclk0. Refer to the Analog Test Strategy section of the Test and Debug Specification for details. The video controller interface and DMA controller blocks are driven by a number of clocks. Clock sources can be one of the three PBUS clock input pins (pbclk0, pbclk1, pbclk2), or the internal display PLL clock. Depending on the particular board design, a video/graphics device may not be available. For the missing devices, clocks may not be available. The clock source could be reset to low, and the device will remain inactive. Internally, there are 5 clocks generated, tabulated as follow:

The video DMA controller 202V operates in multiple clock domains. Control signals from the DMA engine 224 is driven by the core clock. Synchronization is required for active (non-static) signals crossing the clock domains. Three levels of soft resets are provided for the video devices. All the reset control bits are in the v_reset register (8001_0000).

For total video powerdown, vrstb bit can be clear to 0 to resets all the video interface blocks (video in, video out and sync gen.) and video DMA controller 202V. Clearing the bit also drive the external reset pin low to reset all external video/graphics components. For a quick reset, sgrstb, vorstb, virstb, dmardrstb, dmawrrstb bits can be cleared to 0 to reset individual video interface and DMA controller blocks. The reset terminates DMA transfer, and individual state machines immediately. For a nice exit, sgena, viena and voena can be cleared to 0 to terminate the individual state machines. Once disabled, the last frame of data is completed before the state machine is shutdown.

DMA channel resets are managed by the following signals: DMA engine channel enable, video DMA controller reset and video DMA controller channel enable bits. In general, the DMA engine 224 is enabled before the device is started. The order of powering down is not as important, but does affect the type of error interrupts that could result. Refer to the DMA engine 224 document for details of DMA programming model.

V_reset register source is from IO_CLK domain. The synchronization of the reset bits is designed to be fast off/slow on. When CPU 226 writes 0 to one of these bits, it promptly brings the corresponding part to a reset state. When 1 is stored the part recovers synchronously (w.r.t IO_CLK) from reset state. Note that in order to recover from the reset state the IO_CLK must be running. The controller 201 has one HW reset pin which, when asserted, brings the DMA_CLK domain of the controller to a well-defined, default state. This means all the control registers in DMA_CLK domain are reset to 0, including the SW reset bits. Thus asserting HW reset automatically brings the whole video controller block to its reset state.

TABLE 15

Internal clocks generated for video and graphics devices

| clock | sources | destinations | frequency range | possible source device |
|---|---|---|---|---|
| viclk | pbclk0, pbclk1, pbclk2, reset low | video in interface video in DMA controller | 27–35 MHz | external video decoder |
| voclk | DPLL clock, pbclk0, pbclk1, pbclk2, reset low | video out interface 123 video out DMA engine sync generator 202S external video encoder | 27–35 MHz | external video encoder external video decoder DPLL |
| nck | pbclk0, pbclk1, pbclk2, reset low | NIM interface module 121 | ~10 MHz | external NIM device |
| dclk | DPLL clock, pbdclk/2, pbclk0, pbclk1, pbclk2 | display controller | 27–250 MHz | external video encoder external video decoder DPLL |
| pbdclk | DPLL clock, pbclk0, pbclk1, pbclk2 | PBUS graphics data external video encoder Panellink encoder 162 | 25–86 MHz | external video encoder external video decoder DPLL |

All the controller registers listed below are 8-bit wide. All control bits are cleared to zero in reset. Always write zero to reserved bits. Reading of reserved bits return undetermined value.

TABLE 16

Parallel Bus control registers

| Name | Address (CPU) | R/W | Description | Default value |
|---|---|---|---|---|
| v_reset[7:0] | 0x8001_0000 | R/W | video reset control | 8bxx000000 |
| pb_map[7:0] | 0x8001_0020 | R/W | data bus mapping | 8bxxxx0000 |
| pb_csel0[7:0] | 0x8001_0040 | R/W | control bus select 0 | 8bx0000000 |
| pb_csel1[7:0] | 0x8001_0060 | R/W | control bus select 1 | 8bxxxx0000 |
| pb_pb0cfg[7:0] | 0x8001_0080 | R/W | pbus 0 config | 8bx0000000 |
| pb_pb1cfg[7:0] | 0x8001_00A0 | R/W | pbus 1 config | 8bx0000000 |
| pb_pb2cfg[7:0] | 0x8001_00C0 | R/W | pbus 2 config | 8bx0000000 |
| pb_resv[7:0] | 0x8001_00E0 | R/W | reserved | 8bxxxxxxxx |

Note that all rest and ready control bits are reset to 0 during startup. Before enable video in, video out and sync generator 202S blocks be sure vrstb bit is set to 1 as well as the corresponding ready bits. To shutdown the video in, video out and sync generator 202S block, use the enable bit for a nice exit, where the last frame of video data is finished before the interface is shutdown. Use the ready bit foir a quick exit, where the video data transfer is terminated immediately.

The following tables define signals held in the respective registers:

| Bit | Name | Value | Function | Class |
|---|---|---|---|---|
| | | v_reset[7:0] (video reset control) | | |
| [7:6] | reserved | | | N/A |
| [5] | sgrstb | | Sync generator 202S ready | Reset |
| | | 0 | reset sync generator 202S. State machine is reset immediately. All sync outputs are cleared to the value determined by the inversion control bits. | |
| | | 1 | sync generator 202S is ready | |
| [4] | vorstb | | Video out ready | Reset |
| | | 0 | reset video out. State machine is reset immediately. Output data are cleared. | |
| | | 1 | video in interface is ready | |
| [3] | virstb | | Video in ready | Reset |
| | | 0 | reset video in. State machine is reset immediately. Input data and control signals are ignored. | |
| | | 1 | video in interface is ready | |
| [2] | dmardrstb | | Video DMA read controller ready | Reset |
| | | 0 | reset DMA controller | |
| | | 1 | normal operation | |
| [1] | dmawrrstb | | Video DMA write controller ready | Reset |
| | | 0 | reset DMA controller | |
| | | 1 | normal operation | |
| [0] | vrstb | | Video subsystem and external pin reset | Reset |
| | | 0 | reset all video subsystem components including video I/O interface, video DMA engine 224 and sync generator 202S. External video reset pin is driven low to reset all external video/graphics devices. | |
| | | 1 | normal operation | |
| | | pb_map[7:0] (data bus mapping) | | |
| [7:4] | reserved | | | N/A |
| [3] | dttvw | | desktop TV playback output data width | Setup |
| [2] | dttvsw | | desktop TV playback output data swap | Setup |
| | | 0 | 16 bit output | |
| | | 1 | 8 bit output | |
| | | 0 | data output in LS,MS order. (green-blue, red-green in RGB) | |
| | | 1 | data output in MS,LS order. (red-green, green-blue in RGB) | |
| [1] | nimalt | | NIM interface module 121 alternate read bus | Setup |
| | | 0 | video in data is read from data bus 0 | |
| | | 1 | video in data is read from data bus 1 | |
| [0] | vialt | | video capture interface alternate read bus | Setup |
| | | 0 | video in data is read from data bus 0 | |
| | | 1 | video in data is read from data bus 2 | |
| | | pb_csel0[7:0] (control bus select 0) | | |
| [7] | reserved | | | N/A |
| [6:5] | vocsel[1:0] | | video playback control bus source select. Control bus [2,1] are defined as Hsync and Vsync. Control bus [0] xclk is an output. | Setup |
| | | 00 | select control bus from sync generator 202S | |
| | | 01 | select control bus from control bus 0 | |
| | | 10 | select control bus from control bus 1 | |
| | | 11 | select control bus from control bus 2 | |
| [4:2] | vocksel[2:0] | | video playback clock source select. | Setup |
| | | 0XX | stop clock at low state | |
| | | 100 | select clock from display PLL (DPLL) | |
| | | 101 | select clock from control bus 0 | |
| | | 110 | select clock from control bus 1 | |
| | | 111 | select clock from control bus 2 | |
| [1:0] | dccksel[1:0] | | display controller 124 clock source select. | Setup |
| | | 00 | select clock from display PLL (DPLL) | |
| | | 01 | select clock from control bus 0 | |
| | | 10 | select clock from control bus 1 | |
| | | 11 | select clock from control bus 2 | |
| | | pb_csel1[7:0] (control bus select 1) | | |
| [7:4] | reserved | | | N/A |
| [3:2] | nimcsel[1:0] | | NIM control bus and clock source select. Control bus [2:0] are defined as NDEN, NUNCOR, and NPSYNC. | Setup |
| | | 00 | reset control bus to low state | |
| | | 01 | select control bus from control bus 0 | |
| | | 10 | select control bus from control bus 1 | |
| | | 11 | select control bus from control bus 2 | |
| [1:0] | vicsel[1:0] | | video capture control bus and clock source select. Control bus [2:0] are defined as Hsync, Vsync, and | Setup |

-continued

|  |  |  |  |
|---|---|---|---|
|  | DVALID. |  |  |
|  | 00 reset control bus and clock to low state |  |  |
|  | 01 select control bus from control bus 0 |  |  |
|  | 10 select control bus from control bus 1 |  |  |
|  | 11 select control bus from control bus 2 |  |  |
|  | pb_pb0cfg[7:0] (PBUS 0 config) |  |  |
| [7] | reserved |  | N/A |
| [6:5] pbd0cfg[1:0] | parallel data bus 0 configuration. | | Setup |
|  | 00 Data bus is an input bus or tristated |  |  |
|  | 01 Data bus outputs full screen video |  |  |
|  | 10 Data bus outputs desktop to TV graphics |  |  |
|  | 11 Data bus outputs panelLink data |  |  |
| [4:0] pbc0cfg[4:0] | parallel control bus 0 configuration. Control bus pbc0[2:0] is typically: Hsync, Vsync, and Blank/xclk. | | Setup |
| pbc0cfg[4:3] | pbc0[2:1] (hsync, vsync) config |  |  |
|  | 00 control signals are inputs or tristated outputs |  |  |
|  | 01 control signals output Hsync and Vsync from display |  |  |
|  | 10 control signals output Hsync and Vsync from sync generator 202S. Used for video with system-on-chip 111 as sync master. Hsync and Vsync are synchronized with video out data. |  |  |
|  | 11 control signals output Hsync and Vsync from sync generator 202S. Used for Desktop to TV out with system-on-chip 111 as sync master. Hsync and Vsync are synchronized with display controller 124 data. |  |  |
| pbc0cfg[2:1] | pbc0[0] (blank/xclk) config |  |  |
|  | 00 control signal is input or tristated output |  |  |
|  | 01 control signal outputs display controller 124 blank |  |  |
|  | 10 control signal outputs sync generator 202S NPSYNC signal, used for NIM loopback test |  |  |
|  | 11 control signal outputs video encoder 164 clock out signal, used for video encoder 164 connection. If PBD2CFG[1:0] = 2b10, dclk is select. Otherwise, voclk is selected. |  |  |
| pbc0cfg[0] | pbclk0 config |  |  |
|  | 0 control signal is input or tristated output |  |  |
|  | 1 control signal outputs display controller 124 clock |  |  |
|  | Some sample program values for pbc0cfg[4:0] |  |  |
| Video/Graphics Interface | Sync source | pbc0cfg[4:0] setting | |
| NIM | external NIM interface module 121 | 5b00000 | |
| video capture | external video decoder | 5b00000 |  |
| PanelLink | display controller | 5b01011 |  |
| video playback | external video encoder | 5b00000 |  |
| video playback | sync generator 202S | 5b10000 |  |
| desktop to TV | display controller | 5b01110 |  |
| desktop to TV | sync generator 202S | 5b11110 |  |
| NIM loopback | sync generator 202S | 5b10101 |  |
| Vin loopback | sync generator 202S | 5b10001 |  |

| Bit | Name | Value | Function | Class |
|---|---|---|---|---|
|  |  | pb_pb1cfg[7:0] (PBUS 1 config) |  |  |
| [7] | reserved |  |  | N/A |
| [6:5] | pbd1cfg[1:0] |  | parallel data bus 1 configuration. | Setup |
|  |  | 00 | Data bus is an input bus or tristated |  |
|  |  | 01 | Data bus outputs full screen video |  |
|  |  | 10 | Data bus outputs desktop to TV graphics |  |
|  |  | 11 | Data bus outputs panelLink data |  |
| [4:0] | pbc1cfg[4:0] |  | parallel control bus 1 configuration. See pbc0cfg[4:0] for definition of settings | Setup |
|  |  | pb_pb2cfg[7:0] (PBUS 2 config) |  |  |
| [7] | reserved |  |  | N/A |
| [6:5] | pbd2cfg[1:0] |  | parallel data bus 2 configuration. | Setup |
|  |  | 00 | Data bus is an input bus or tristated |  |
|  |  | 01 | Data bus outputs full screen video |  |
|  |  | 10 | Data bus outputs desktop to TV graphics |  |
|  |  | 11 | Data bus outputs panelLink data |  |
| [4:0] | pbc2cfg[4:0] |  | parallel control bus 2 configuration. See pbc0cfg[4:0] for definition of settings | Setup |
|  |  | pb_resv[7:0] (reserved) |  |  |
| [7:0] | reserved |  |  | N/A |

TABLE 17

Sync generator 202S registers

| Name | Address | R/W | Description | Default value |
|---|---|---|---|---|
| sg_cfg[7:0] | 0x8001_0100 | R/W | sync generator 202S config | 8bx0000000 |
| sg_htot[7:0] | 0x8001_0120 | R/W | sync gen. h. total pixel width | 8b00000000 |
| sg_ovtot[7:0] | 0x8001_0140 | R/W | sync gen. odd v. total height | 8b00000000 |
| sg_evtot[7:0] | 0x8001_0160 | R/W | sync gen. even v. total height | 8b00000000 |
| sg_xtot[7:0] | 0x8001_0180 | R/W | sync gen. extra total counts | 8b00000000 |
| sg_hspw[7:0] | 0x8001_01A0 | R/W | sync gen. Hsync pulse width | 8b00000000 |
| sg_xpw[7:0] | 0x8001_01C0 | R/W | sync gen. extra pulse width | 8bxxxx0000 |
| sg_res[7:0] | 0x8001_01E0 | R/W | reserved | 8bxxxxxxxx |

| Bit | Name | Value | Function | Class |
|---|---|---|---|---|
| | | | sg_cfg[7:0] (sync generator 202S config) | |
| [7] | reserved | | | N/A |
| [6] | sgena | | sync generator 202S enable | Initiate |
| | | 0 | disable sync generator 202S. Finish current active field before stopping the state machine. | |
| | | 1 | enable sync generator 202S | |
| [5:4] | sgvsomode[1:0] | | sync generator 202S Vsync output mode. | Setup |
| | | 00 | Except for field mode, all Vsync modes generate an active low vsync signal. A two line wide ÔoÕ pulse is issued at the beginning of every frame. In all cases, the first line starts at the Hsync leading edge following Vsync leading edge. When the two leading edges occurs on the same cycle, the first line starts at the following Hsync. | |
| | | 01 | Interlaced Vsync mode A: For odd fields, Vsync and Hsync leading edges are coincident. For even fields, Vsync leading edges coincide with Hsync trailing edge. Field mode: Field output mode, low for odd fields, and high for even fields. Leading edge coincides with Hsync trailing edge. Interlaced Vsync mode B: | |
| | | 10 | For odd fields, Vsync and Hsync leading edges are coincident. For even fields, Vsync leading edges occurs in middle of a video line. Progressive Vsync mode: | |
| | | 11 | Vsync leading edges coincide with Hsync trailing edge. Sgovtot and sgevtot should be programmed with the same value. | |
| [3:2] | sgvsimode[1:0] | | sync generator 202S Vsync input mode | Setup |
| | | 00 | Horizontal and vertical counters starts shortly after SGENA is enabled. Hsync and Vsync has arbitrary phase in this mode. | |
| | | 01 | Horizontal and vertical counters synchronized to the first rising edge of display controller 124 Vsync after SGENA is enabled. Counters start 2 voclk after sync event. First field edge output lines up with second Vsync input edge with a delay of 2 voclks. | |
| | | 10 | Horizontal and vertical counters synchronized to the first failing edge of display controller 124 Vsync after SGENA is enabled. Counters start 2 voclk after sync event. First field edge output lines up with second Vsync input edge with a delay of 2 voclks. | |
| | | 11 | Horizontal and vertical counters synchronized to the first transition of display controller 124 Vsync after SGENA is enabled. Counters start 2 voclk after sync event. First field edge output lines up with second Vsync input edge with a delay of 2 voclks. | |
| [1] | sgvsinv | | sync generator 202S Vsync output inversion low | Setup |
| | | 0 | active Vsync output | |
| | | 1 | high active Vsync output | |
| [0] | sghsinv | | sync generator 202S Hsync output inversion | Setup |
| | | 0 | low active Hsync output | |
| | | 1 | high active Hsync output | |
| | | | sg_htot[7:0] (sync gen horizontal total pixel width) | |
| [7:0] | sghtot[7:0] | | sync generator 202S horizontal total width n: line width = n + 1 clocks cycles. For 8 bit interface, n should be set to (pixel_count)*2−1. | Setup |
| | | | sg_ovtot[7:0] (sync generator 202S odd field total vertical height) | |
| [7:0] | sgovtot[7:0] | | sync generator 202S odd field total vertical height n: odd field height = (n + 1) lines | Setup |
| | | | sg_evtot[7:0] (sync generator 202S even field total vertical height) | |
| [7:0] | sgevtot[7:0] | | sync generator 202S even field total vertical height n: even field height = (n + 1) lines | Setup |

-continued

| Bit | Name | Value | Function | Class |
|---|---|---|---|---|
| | | sg_xtot[7:0] (sync generator 202S extra total count) | | |
| [7:6] | sgevtot[9:8] | | MSBs of even field total vertical height | Setup |
| [5:4] | sgovtot[9:8] | | MSBs of odd field total vertical height | Setup |
| [3:0] | sghtot[11:8] | | MSBs of horizontal total pixel width | Setup |
| | | sg_hspw[7:0] (sync generator 202S Hsync pulse width) | | |
| [7:0] | sghspw[7:0] | | sync generator 202S Hsync pulse width. Also used to specify NIM parity data width, i.e., sync period minus data packet size. | Setup |
| | | sg_xpw[7:0] (sync generator 202S extra pulse width) | | |
| [7:4] | reserved | | | N/A |
| [3:0] | sghspw[11:8] | | MSBs of Hsync pulse width | Setup |
| | | sg_res[7:0] (reserved) | | |
| [7:0] | reserved | | | N/A |

TABLE 18

Video interface control registers

| Name | Address | R/W | Description | Default value |
|---|---|---|---|---|
| vi_cfg0[7:0] | 0x8001_0200 | R/W | video capture config 0 | 8bxx000000 |
| vi_cfg1[7:0] | 0x8001_0220 | R/W | video capture config 1 | 8bx0000000 |
| vo_cfg0[7:0] | 0x8001_0240 | R/W | video playback config 0 | 8bx0000000 |
| vo_cfg1[7:0] | 0x8001_0260 | R/W | video playback config 1 | 8b00000000 |
| v_res0[7:0] | 0x8001_0280 | R/W | reserved | 8bxxxxxxxx |
| v_res1[7:0] | 0x8001_02A0 | R/W | reserved | 8bxxxxxxxx |
| v_res2[7:0] | 0x8001_02C0 | R/W | reserved | 8bxxxxxxxx |
| v_res3[7:0] | 0x8001_02E0 | R/W | reserved | 8bxxxxxxxx |

Configuration and Control interface:

| Bit | Name | Value | Function | Class |
|---|---|---|---|---|
| | | vi_cfg0[7:0] (video capture config 0) | | |
| [7:6] | reserved | | | N/A |
| [5] | viena | | video in enable. Sampled at the start of a field. | Initiate |
| | | 0 | finish current active field then stop state machine | |
| | | 1 | enable video input capture. Start field capture state machine and run to the end of the field. | |
| [4] | viofena | | video in odd field enable | Setup |
| | | 0 | disable odd field capture | |
| | | 1 | enable odd field capture | |
| [3] | viefena | | video in even field enable | Setup |
| | | 0 | disable even field capture | |
| | | 1 | enable even field capture | |
| [2] | vihmode | | horizontal trigger mode | Setup |
| | | 0 | horizontal trigger on falling edge of vihs | |
| | | 1 | horizontal trigger on rising edge of vihs | |
| [1:0] | vivmode[1:0] | | vertical trigger mode | Setup |
| | | 00 | odd trigger on f edge of vivs (field input), even trigger on r edge of vivs | |
| | | 01 | odd trigger on r edge of vivs (field input), even trigger on f edge of vivs | |
| | | 10 | odd trigger on f edge of vivs with vihs low even trigger on f edge of vivs with vihs high | |
| | | 11 | odd trigger on f edge of vivs with vihs high even trigger on f edge of vivs with vihs low | |
| | | vi_cfg1[7:0] (video capture config 1) | | |
| [7] | reserved | | | N/A |
| [6] | viignvld | | video in ignore valid input | Setup |
| | | 0 | only capture data when valid bit is set | |
| | | 1 | ignore value of valid bit | |
| [5] | vi656ena | | CCIR656 sync detection enable | Setup |
| | | 0 | use sync input signals for sync detection | |
| | | 1 | detect 656 EAV codes and extract sync information from data. | |
| [4:0] | vilctmode[4:0] | | line count interrupt mode, interrupt after n*8 lines. When n = 0, line interrupt is not generated. Line interrupt range: 8–248. Line count restarts after every interrupt. | Setup |
| | | vo_cfg0[7:0] (video playback config 0) | | |
| [7] | reserved | | | N/A |
| [6] | vobstena | | Bytestream enable | Setup |
| | | 0 | output data without bytestream codes. | |
| | | 1 | output data with bytestream codes. | |
| [5] | voena | | video out enable. Sampled at the start of a field. | Initiate |
| | | 0 | finish current active field then stop state machine | |
| | | 1 | enable video output playback. Start field playback state machine and run to the end of the field. | |
| [4] | voofena | | video out odd field enable | Setup |
| | | 0 | disable odd field playback | |
| | | 1 | enable odd field playback | |
| [3] | voefena | | video out even field enable | Setup |
| | | 0 | disable even field playback | |
| | | 1 | enable even field playback | |
| [2] | vohmode | | horizontal trigger mode | Setup |
| | | 0 | horizontal trigger on falling edge of vohs | |
| | | 1 | horizontal trigger on rising edge of vohs | |
| [1:0] | vovmode[1:0] | | vertical trigger mode | Setup |
| | | 00 | odd trigger on f edge of vovs (field input), even trigger on r edge of vovs | |
| | | 01 | odd trigger on r edge of vovs (field input), even trigger on f edge of vovs | |
| | | 10 | odd trigger on f edge of vovs with vohs low even trigger on f edge of vovs with vohs high | |
| | | 11 | odd trigger on f edge of vovs with vohs high even trigger on f edge of vovs with vohs low | |

-continued

| Bit | Name | Value | Function | Class |
|---|---|---|---|---|
| | vo_cfg1[7:0] (video playback config 1) | | | |
| [7] | voblkena | | blank enable | Setup |
| | | 0 | output {8h00,8h00} during inactive portion of video stream | |
| | | 1 | output {8h80,8h10} during inactive portion of video stream | |
| [6] | vosatena | | saturation enable | Setup |
| | | 0 | output pixel data exactly as read from RDRAM | |
| | | 1 | saturate the pixel data from 8h01 to 8hfd inclusive.video out ignore valid input | |
| [5] | vo656ena | | CCIR656 code insertion enable | Setup |
| | | 0 | output data without 656 SAV and EAV codes. | |
| | | 1 | output data with 656 SAV and EAV codes. When VO656ENA is true SAV and EAV codes are inserted on all lines. An SAV code is inserted during the 4 clocks immediately before the start of active video. EAV is inserted during the 4 clocks immediately following the end of active video. | |
| [4:0] | votctmode[4:0] | | line count interrupt mode, interrupt after n*8 lines. When n = 0, line interrupt is not generated. Line interrupt range: 8–248. Line count restarts after every interrupt. | Setup |
| | v_res0[7:0] (reserved) | | | |
| [7:0] | reserved | | | N/A |
| | v_res1[7:0] (reserved) | | | |
| [7:0] | reserved | | | N/A |
| | v_res2[7:0] (reserved) | | | |
| [7:0] | reserved | | | N/A |
| | v_res3[7:0] (reserved) | | | |
| [7:0] | reserved | | | N/A |

TABLE 19

Video capture delay and size registers

| Name | Address | R/W | Description | Default value |
|---|---|---|---|---|
| vi_ofvdly[7:0] | 0x8001_0300 | R/W | video in odd field vertical delay | 8b00000000 |
| vi_efvdly[7:0] | 0x8001_0320 | R/W | video in even field vertical delay | 8b00000000 |
| vi_hdly[7:0] | 0x8001_0340 | R/W | video in horizontal delay | 8b00000000 |
| vi_xdly[7:0] | 0x8001_0360 | R/W | video in extra delay bits | 8b00000000 |
| vi_fsize[7:0] | 0x8001_0380 | R/W | video in field size | 8b00000000 |
| vi_lsize[7:0] | 0x8001_03A0 | R/W | video in line size | 8b00000000 |
| vi_xsize[7:0] | 0x8001_03C0 | R/W | video in extra size bits | 8bxxx00000 |
| vi_rsize[7:0] | 0x8001_03E0 | R/W | video in remainder size | 8bxxxx0000 |

| Bit | Name | Value | Function | Class |
|---|---|---|---|---|
| | vi_ofvdly[7:0] (video in odd field vertical delay) | | | |
| [7:0] | viofvdly[7:0] | | video in odd field vertical delay n: skip n horizontal triggers after an odd field vertical trigger | Setup |
| | vi_efvdly[7:0] (video in even field vertical delay) | | | |
| [7:0] | viefvdly[7:0] | | video in even field vertical delay n: skip n horizontal triggers after an even field vertical trigger | Setup |

-continued

| Bit | Name | Value | Function | Class |
|---|---|---|---|---|
| | vi_hdly[7:0] (video in horizontal delay) | | | |
| [7:0] | vihdly[7:0] | | video in horizontal delay n: skip n + 1 clock cycles after a horizontal trigger before the first active pixel. Note: with an 8-bit interface, VICLK is 2x the pixel rate. When VIHDLY = 0 there is a horizontal delay of 1. | Setup |

| Bit | Name | Value Function | Class |
|---|---|---|---|
| | | vi_xdly[7:0] (video in extra delay bits) | |
| [7:4] | vihdly[11:8] | MSBs of horizontal delay | Setup |
| [3:2] | viefvdly[9:8] | MSBs of even field vertical delay | Setup |
| [1:0] | viofvdly[9:8] | MSBs of odd field vertical delay | Setup |
| | | vi_fsize[7:0] (video in field size) | |
| [7:0] | vifsize[7:0] | active lines per field<br>n: (n + 1) active lines per field | Setup |
| | | vi_lsize[7:0] (video in line size) | |
| [7:0] | vilsize[7:0] | number of pixels/video scan line<br>n: (n + 1) pixels per line, maximum of 2048 pixels. | Setup |
| | | vi_xsize[7:0] (video in extra size bits) | |
| [7:5] | reserved | | N/A |
| [4:2] | vilsize[10:8] | MSBs of line size | Setup |
| [1:0] | vifsize[9:8] | MSBs of field size | Setup |
| | | vi_rsize[7:0] (video in remainder size) | |
| [7:4] | reserved | | N/A |
| [3:0] | virsize[3:0] | number of remainder pixels to fill a 32 byte block at the end of a frame. 2 bytes per pixel. | Setup |

| Bit | Name | Value Function | Class |
|---|---|---|---|
| | | vo_fsize[7:0] (video out field size) | |
| [7:0] | vofsize[7:0] | active lines per field<br>n: (n + 1) active lines per field | Setup |
| | | vo_lsize[7:0] (video out line size) | |
| [7:0] | volsize[7:0] | number of pixels/video scan line<br>n: (n + 1) pixels per line, maximum of 2048 pixels. | Setup |
| | | vo_xsize[7:0] (video out extra size bits) | |
| [7:5] | reserved | | N/A |
| [4:2] | volsize[10:8] | MSBs of line size | Setup |
| [1:0] | vofsize[9:8] | MSBs of field size | Setup |
| | | vo_rsize[7:0] (video out remainder size) | |
| [7:4] | reserved | | N/A |
| [3:0] | vorsize[3:0] | number of remainder pixels to fill a 32 byte block at the end of a frame. 2 bytes per pixel. | Setup |

TABLE 20

Video playback delay and size registers

| Name | Address | R/W | Description | Default value |
|---|---|---|---|---|
| vo_ofvdly[7:0] | 0x8001_0400 | R/W | video out odd field vertical delay | 8b00000000 |
| vo_efvdly[7:0] | 0x8001_0420 | R/W | video out even field vertical delay | 8b00000000 |
| vo_hdly[7:0] | 0x8001_0440 | R/W | video out horizontal delay | 8b00000000 |
| vo_xdly[7:0] | 0x8001_0460 | R/W | video out extra delay bits | 8b00000000 |
| vo_fsize[7:0] | 0x8001_0480 | R/W | video out field size | 8b00000000 |
| vo_lsize[7:0] | 0x8001_04A0 | R/W | video out line size | 8b00000000 |
| vo_xsize[7:0] | 0x8001_04C0 | R/W | video out extra size bits | 8bxxx00000 |
| vo_rsize[7:0] | 0x8001_04E0 | R/W | video out remainder size | 8bxxxx0000 |

| Bit | Name | Value Function | Class |
|---|---|---|---|
| | | vo_ofvdly[7:0] (video out odd field vertical delay) | |
| [7:0] | voofvdly[7:0] | video out odd field vertical delay<br>n: skip n horizontal triggers after an odd field vertical trigger | Setup |
| | | vo_efvdly[7:0] (video out even field vertical delay) | |
| [7:0] | voefvdly[7:0] | video out even field vertical delay<br>n: skip n horizontal triggers after an even field vertical trigger | Setup |
| | | vo_hdly[7:0] (video out horizontal delay) | |
| [7:0] | vohdly[7:0] | video out horizontal delay<br>n: skip n + 3 clock cycles after a horizontal trigger before the first active pixel.<br>Note: with an 8-bit interface, VOCLK is 2x the pixel rate. | Setup |
| | | vo_xdly[7:0] (video out extra delay bits) | |
| [7:4] | vohdly[11:8] | MSBs of horizontal delay | Setup |
| [3:2] | voefvdly[9:8] | MSBs of even field vertical delay | Setup |
| [1:0] | voofvdly[9:8] | MSBs of odd field vertical delay | Setup |

TABLE 21

Video DMA control and status registers

| Name | Address | R/W | Description | Default value |
|---|---|---|---|---|
| vdma_ctrl[7:0] | 0x8001_0400 | R/W | DMA control | 8bxxxxxx00 |
| vdma_inti[7:0] | 0x8001_0420 | RW1C | DMA video in interrupt | 8bxx000000 |
| vdma_intim[7:0] | 0x8001_0440 | R/W | DMA video in interrupt mask | 8bxx000000 |
| vdma_into[7:0] | 0x8001_0460 | RW1C | DMA video out interrupt | 8bxx000000 |
| vdma_intom[7:0] | 0x8001_0480 | R/W | DMA video out interrupt mask | 8bxx000000 |
| vdma_wptr[7:0] | 0x8001_04A0 | RO | SRAM write pointer | 8bxx000000 |
| vdma_rptr[7:0] | 0x8001_04C0 | RO | SRAM read pointer | 8bxx000000 |
| vdma_res[7:0] | 0x8001_04E0 | R/W | reserved | 8bxxxxxxxx |

| Bit | Name | Value | Function | Class |
|---|---|---|---|---|
| | | | vdma_ctrl[7:0] (video DMA control) | |
| [7:2] | reserved | | | N/A |
| [1] | vdmawren | | Video DMA write enable (capture) | Initiate |
| | | 0 | DMA disabled | |
| | | 1 | DMA enabled | |
| [0] | vdmarden | | Video DMA read enable (playback) | Initiate |
| | | 0 | DMA disabled | |
| | | 1 | DMA enabled | |
| | | | vdma_inti[7:0] (DMA video in interrupt) | |
| [7:6] | reserved | | | N/A |
| [5] | vdmawrorun | | Video DMA write overrun interrupt | Interrupt |
| | | 0 | no interrupt detected | |
| | | 1 | write overrun error occurred | |
| [4] | vilcnto | | Video in line count zero detect interrupt | Interrupt |
| | | 0 | no interrupt detected | |
| | | 1 | interrupt occurred | |
| [3] | vieend | | Video in even field end interrupt | Interrupt |
| | | 0 | no interrupt detected | |
| | | 1 | interrupt occurred | |
| [2] | viestart | | Video in even field start interrupt | Interrupt |
| | | 0 | no interrupt detected | |
| | | 1 | interrupt occurred | |
| [1] | vioend | | Video in odd field end interrupt | Interrupt |
| | | 0 | no interrupt detected | |
| | | 1 | interrupt occurred | |
| [0] | viostart | | Video in odd field start interrupt | Interrupt |
| | | 0 | no interrupt detected | |
| | | 1 | interrupt occurred | |

Note:
write 1 to clear interrupt, write 0 leaves bit untouched

| | | | vdma_intim[7:0] (DMA video in interrupt mask) | |
|---|---|---|---|---|
| [7:6] | reserved | | | N/A |
| [5] | vdmawrien | | Video DMA write interrupt enable | Setup |
| | | 0 | mask interrupt | |
| | | 1 | enable interrupt | |
| [4] | vilcntien | | Video in line count interrupt enable | Setup |
| | | 0 | mask interrupt | |
| | | 1 | enable interrupt | |
| [3] | vieeien | | Video in even field end interrupt enable | Setup |
| | | 0 | mask interrupt | |
| | | 1 | enable interrupt | |
| [2] | viesien | | Video in even field start interrupt enable | Setup |
| | | 0 | mask interrupt | |
| | | 1 | enable interrupt | |
| [1] | vioeien | | Video in odd field end interrupt enable | Setup |
| | | 0 | mask interrupt | |
| | | 1 | enable interrupt | |
| [0] | viosien | | Video in odd field start interrupt enable | Setup |
| | | 0 | mask interrupt | |
| | | 1 | enable interrupt | |

Note:
write 0 to mask interrupt from affecting interrupt signal. Interrupt bits are not masked by interrupt enable bits.

| | | | vdma_into[7:0] (DMA video out interrupt) | |
|---|---|---|---|---|
| [7:6] | reserved | | | N/A |

-continued

| Bit | Name | Value | Function | Class |
|---|---|---|---|---|
| [5] | vdmardurun | | video DMA read underrun interrupt | Interrupt |
| | | 0 | no interrupt detected | |
| | | 1 | read underrun error occurred | |
| [4] | volcnto | | video out line count zero detect interrupt | Interrupt |
| | | 0 | no interrupt detected | |
| | | 1 | interrupt occurred | |
| [3] | voeend | | video out even field end interrupt | Interrupt |
| | | 0 | no interrupt detected | |
| | | 1 | interrupt occurred | |
| [2] | voestart | | video out even field start interrupt | Interrupt |
| | | 0 | no interrupt detected | |
| | | 1 | interrupt occurred | |
| [1] | vooend | | video out odd field end interrupt | Interrupt |
| | | 0 | no interrupt detected | |
| | | 1 | interrupt occurred | |
| [0] | voostart | | video out odd field start interrupt | Interrupt |
| | | 0 | no interrupt detected | |
| | | 1 | interrupt occurred | |

Note:
write 1 to clear interrupt, write 0 leaves bit untouched vdma_intim[7:0] (DMA video out interrupt mask)

| Bit | Name | Value | Function | Class |
|---|---|---|---|---|
| [7:6] | reserved | | | N/A |
| [5] | vdmardien | | video DMA read interrupt enable | Setup |
| | | 0 | mask interrupt | |
| | | 1 | enable interrupt | |
| [4] | volcntien | | video out line count interrupt enable | Setup |
| | | 0 | mask interrupt | |
| | | 1 | enable interrupt | |
| [3] | voeeien | | video out even field end interrupt enable | Setup |
| | | 0 | mask interrupt | |
| | | 1 | enable interrupt | |
| [2] | voesien | | video out even field start interrupt enable | Setup |
| | | 0 | mask interrupt | |
| | | 1 | enable interrupt | |
| [1] | vooeien | | video out odd field end interrupt enable | Setup |
| | | 0 | mask interrupt | |
| | | 1 | enable interrupt | |
| [0] | voosien | | video out odd field start interrupt enable | Setup |
| | | 0 | mask interrupt | |
| | | 1 | enable interrupt | |

Note:
write 0 to mask interrupt from affecting interrupt signal. Interrupt bits are not masked by interrupt enable bits.

vdma_wptr[7:0] (DMA SRAM write pointer)

| Bit | Name | Function | Class |
|---|---|---|---|
| [7:6] | reserved | | N/A |
| [5:0] | sramwrptr[5:0] | SRAM write pointer | Status |

Note:
These Read-Only registers are for monitoring purpose only. Each register holds the current value of I/O-SRAM address pointer of its associated DMA channel.

vdma_rptr[7:0] (DMA SRAM read pointer)

| Bit | Name | Function | Class |
|---|---|---|---|
| [7:6] | reserved | | N/A |
| [5:0] | sramrdptr[5:0] | SRAM read pointer | Status |

Note:
These Read-Only registers are for monitoring purpose only. Each register holds the current value of I/O-SRAM address pointer of its associated DMA channel.

vdma_res[7:0] (reserved)

| Bit | Name | Function | Class |
|---|---|---|---|
| [7:0] | reserved | | N/A |

TABLE 22

Video Controller Register Map

| Register | bit 7 | bit 6 | bit 5 | bit 4 | bit 3 | bit 2 | bit 1 | bit 0 |
|---|---|---|---|---|---|---|---|---|
| PBUS registers (Address: 8001_0000–8001_00E0) | | | | | | | | |
| v_reset | resv | resv | sgrstb | vorstb | virstb | dmardrstb | dmawrrstb | vrstb |
| pb_map | resv | resv | resv | resv | dttvsw | dttvw | nimalt | vialt |

TABLE 22-continued

Video Controller Register Map

| Register | bit 7 | bit 6 | bit 5 | bit 4 | bit 3 | bit 2 | bit 1 | bit 0 |
|---|---|---|---|---|---|---|---|---|
| pb_csel0 | resv | vocsel[1:0] | | vocksel[2:0] | | | dccksel[1:0] | |
| pb_csel1 | resv | resv | resv | resv | nimcsel[1:0] | | vicsel[1:0] | |
| pb_pb0cfg | resv | pbd0cfg[1:0] | | pbc0cfg[4:0] | | | | |
| pb_pb1cfg | resv | pbd1cfg[1:0] | | pbc1cfg[4:0] | | | | |
| pb_pb2cfg | resv | pbd1cfg[1:0] | | pbc2cfg[4:0] | | | | |
| pb_res | resv | resv | resv | resv | resv | resv | resv | resv |
| Sync generator 202S registers (Address: 8001_0100–8001_01E0) | | | | | | | | |
| sg_cfg | resv | sgena | sgvsomode[1:0] | | sgvsimode[1:0] | | sgvsinv | sghsinv |
| sg_htot | sghtot[7:0] | | | | | | | |
| sg_ovtot | sgovtot[7:0] | | | | | | | |
| sg_evtot | sgevtot[7:0] | | | | | | | |
| sg_xtot | sgevtot[9:8] | | sgovtot[9:8] | | | | sghtot[11:8] | |
| sg_hspw | sghspw[7:0] | | | | | | | |
| sg_xpw | resv | resv | resv | resv | resv | | sghspw[11:8] | |
| sg_res | resv | resv | resv | resv | resv | resv | resv | resv |
| Video interface control registers (Address: 8001_0200–8001_02E0) | | | | | | | | |
| vi_cfg0 | resv | resv | viena | viofena | viefena | vihmode | vivmode[1:0] | |
| vi_cfg1 | resv | viignvld | vi656ena | | vilctmode[4:0] | | | |
| vo_cfg0 | resv | vobstena | voena | voofena | voefena | vohmode | vovmode[1:0] | |
| vo_cfg1 | voblkena | vosatena | vo656ena | | volctmode[4:0] | | | |
| v_res0 | resv | resv | resv | resv | resv | resv | resv | resv |
| v_res1 | resv | resv | resv | resv | resv | resv | resv | resv |
| v_res2 | resv | resv | resv | resv | resv | resv | resv | resv |
| v_res3 | resv | resv | resv | resv | resv | resv | resv | resv |
| Video capture delay and size registers (Address: 8001_0300–8001_03E0) | | | | | | | | |
| vi_ofvdly | viofvdly[7:0] | | | | | | | |
| vi_efvdly | viefvdly[7:0] | | | | | | | |
| vi_hdly | vihdly[7:0] | | | | | | | |
| vi_xdly | vihdly[11:8] | | viefvdly[9:8] | | viofvdly[9:8] | | | |
| vi_fsize | vifsize[7:0] | | | | | | | |
| vi_lsize | vilsize[7:0] | | | | | | | |
| vi_xsize | resv | resv | resv | vilsize[10:8] | | | vifsize[9:8] | |
| vi_rsize | resv | resv | resv | resv | virsize[3:0] | | | |
| Video playback delay and size registers (Address: 8001_0400–8001_04E0) | | | | | | | | |
| vo_ofvdly | voofvdly[7:0] | | | | | | | |
| vo_efvdly | voefvdly[7:0] | | | | | | | |
| vo_hdly | vohdly[7:0] | | | | | | | |
| vo_xdly | vohdly[11:8] | | voefvdly[9:8] | | voofvdly[9:8] | | | |
| vo_fsize | vofsize[7:0] | | | | | | | |
| vo_lsize | volsize[7:0] | | | | | | | |
| vo_xsize | resv | resv | resv | volsize[10:8] | | | vofsize[9:8] | |
| vo_rsize | resv | resv | resv | resv | vorsize[3:0] | | | |
| Video DMA control and status register (Address: 8001_0500–8001_05E0) | | | | | | | | |
| vdma_ctrl | resv | resv | resv | resv | resv | resv | dmawten | dmarden |
| vdma_inti | resv | resv | dmawrorun | vilcnt0 | vieend | viestart | vioend | viostart |
| vdma_intim | resv | resv | dmawrien | vilcntien | vieeien | viesien | vioeien | viosien |
| vdma_into | resv | resv | dmardurun | volcnt0 | voeend | voestart | vooend | voostart |
| vdma_intom | resv | resv | dmardien | volcntien | voeeien | voesien | vooeien | voosien |
| vdma_wptr | resv | resv | | | sramwrptr[5:0] | | | |
| vdma_rptr | resv | resv | | | sramrdptr[5:0] | | | |
| vdma_res | resv | resv | resv | resv | resv | resv | resv | resv |

Note:
*set display controller 124 data enable bit to drive dod[23:0] bus

TABLE 23

Video DMA sector configuration registers

| Register | [63] | [62:50] | [49:32] | [31:0] |
|---|---|---|---|---|
| Video in DMA sector config registers (Address: 9000_0000–9000_0008) | | | | |
| vi_sa | vi_vld_a | resva[12:0] | vi_tc_a[17:0] | vi_sa_a[31:0] |
| vi_sb | vi_vld_b | resvb[12:0] | vi_tc_b[17:0] | vi_sa_b[31:0] |
| Video out DMA sector config registers (Address: 9000_0030–9000_0038) | | | | |
| vo_sa | vo_vld_a | resva[12:0] | vo_tc_a[17:0] | vo_sa_a[31:0] |
| vo_sb | vo_vld_b | resvb[12:0] | vo_tc_b[17:0] | vo_sa_b[31:0] |

TABLE 23-continued

Video DMA sector configuration registers

| Register | [63] | [62:50] | [49:32] | [31:0] |
|---|---|---|---|---|

Note:
Sector A and B registers should be accessed in a single 64 bit register read/write. Each Video in and out channel has a set of sector A and B program values. Each set contains a valid bit, terminal count, and starting address values.

TABLE 24

DMA engine 224 interrupt and enable registers

| Register | address | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|
| reserved | 8000_0000 | resv | acc9_7_o_2 | acc9_7_o_1 | acc9_7_o_0 | spdif_o | res_v | res_v | vid_o_0 | vei_v | ici_1_0 | nicm_0 | nicm | a9d7_f_i_0 | scpdmi_i | rms_v | rv | vid_i_0 |
| dma_enable[15:0] | 8000_0020 | | | | | | | | | | | | | | | | |
| sector_comp_int[15:0] | 8000_0040 | | | | | | | | | | | | | | | | |
| sector_comp_int_en[15:0] | 8000_0060 | | | | | | | | | | | | | | | | |
| sector_invalid_int[15:0] | 8000_0080 | | | | | | | | | | | | | | | | |
| sector_invalid_int_en[15:0] | 8000_00A0 | | | | | | | | | | | | | | | | |
| dma_emu_req[15:0] | 8000_00C0 | | | | | | | | | | | | | | | | |
| dma_emu_req_en[15:0] | 8000_00E0 | | | | | | | | | | | | | | | | |
| dma_emu_ack[15:0] | 8000_0100 | | | | | | | | | | | | | | | | |
| video_emu_ack[15:0] | 8000_0120 | | | | | | | | | | | | | | | | |

The example illustrated in FIG. 5 provides a cost-effective and flexible apparatus and method for an integrated circuit that includes various video interfaces and a limited number of pads that can be configured to connect to the various external video devices. Further, the pads can be statically configured or dynamically configured, which provides a more flexible and efficient use of the pads than a non-configurable hardwired approach.

Numerous modifications and adaptations of the embodiments described herein will be apparent to the skilled artisan in view of the disclosure. For example, although certain specify implementation details are described above in one example in reference to FIG. 5, many other embodiments are possible. Also, instead of disabling the various modules (as described above in reference to act 93 of FIG. 2C), such modules can be decoupled from each other by changing the couplings in crossbar switch 11, thereby to prevent data transfer therebetween. Various such modifications and adaptations of the embodiments described herein are encompassed by the attached claims.

What is claimed is:

1. An integrated circuit chip comprising:
a plurality of functional modules, each functional module having a plurality of gates, each functional module having at least one group of terminals (hereinafter "internal function group");
a plurality of pads capable of connection to circuitry external to the integrated circuit chip, the plurality of pads being subdivided into a number of groups (hereinafter "external function groups"), the number of pads in each external function group being equal to the number of terminals in each internal function group; and
a crossbar switch having a plurality of internal ports and a plurality of external ports, each external port being permanently coupled to an external function group, each internal port being permanently coupled to an internal function group;
wherein:
the crossbar switch is capable of coupling any port from a set consisting of the plurality of internal ports and the plurality of external ports only to another port from the set; and
the external ports are smaller in number than the internal ports, so that at any given time at least one internal port is uncoupled from all external ports.

2. The integrated circuit chip of claim 1 wherein:
each functional module is formed without programming a gate array; and
during operation each functional module performs a predetermined function different from another function of another functional module in the plurality of functional modules, and the integrated circuit chip acts as a system-on-chip.

3. The integrated circuit chip of claim 2 wherein:
the crossbar switch has a control port;
in response to a first control signal at the control port, the crossbar switch couples a first external port in the plurality of external ports to a first internal port in plurality of internal ports; and
in response to a second control signal at the control port, the crossbar switch uncouples the first internal port from the first external port and couples the first external port to a second internal port.

4. The integrated circuit chip of claim 2 further comprising:
a storage element capable of holding either of the first control signal and the second control signal, the storage element being coupled to the control port.

5. The integrated circuit chip of claim 1 wherein:
the crossbar switch has a control port; and
in response to a control signal at the control port, the crossbar switch couples a first internal port in the plurality of internal ports to a second internal port in the plurality of internal ports.

6. The integrated circuit chip of claim 1 wherein:
the crossbar switch has a control port; and
in response to a control signal at the control port, the crossbar switch couples the first external port to the second external port.

7. The integrated circuit chip of claim 1 wherein:

the crossbar switch comprises at least one multiplexer having a first input bus permanently coupled to said "at least one functional module", a second input bus permanently coupled to another functional module, and an output bus that is coupled temporarily to the second input bus; and each of the first input bus, the second input bus, and the output bus have a predetermined width.

8. The integrated circuit chip of claim 7 further comprising:

a storage element coupled to said multiplexer, the storage element holding a configuration signal indicative of temporary couplings between ports of the crossbar switch, the temporary couplings including coupling of the output bus to the second input bus.

9. The integrated circuit chip of claim 1 wherein:

one of the functional modules includes a video input interface circuit; and another of the functional modules includes a video output interface circuit.

10. The integrated circuit chip of claim 9 wherein:

yet another of the functional modules includes a display controller; and still another of the functional modules includes a network interface circuit.

11. The integrated circuit chip of claim 1 further comprising:

a number of additional pads permanently coupled to at least one functional module in the plurality of functional modules; and during operation the additional pads carry address signals.

12. An apparatus comprising:

an integrated circuit chip having: (i) a plurality of pads capable of connection to circuitry external to the integrated circuit chip, the plurality of pads being subdivided into a number of groups (hereinafter "external function groups"), (ii) a plurality of functional modules, each functional module having at least one group of terminals (hereinafter "internal function group"), (iii) a crossbar switch having a plurality of internal ports and a plurality of external ports, each external port being permanently coupled to an external function group, each internal port being permanently coupled to an internal function group, and (iv) a configuration circuit having a control bus coupled to the crossbar switch and a plurality of enable lines, each enable line being coupled to one of the function modules; and external circuitry having a plurality of data buses permanently coupled to the respective external function groups; wherein:

to couple a first function module to the external circuitry, the configuration circuit drives an active signal on a first enable line coupled to the first function module, and also drives a first control signal to the crossbar switch via the control bus; and to couple a second function module to the external circuitry, the configuration circuit drives an active signal on a second enable line coupled to the second function module, and also drives a second control signal to the configuration switch via the control bus.

13. The apparatus of claim 12 wherein:

to test a function module having at least two internal function groups, the configuration circuit drives a third control signal to the crossbar switch for coupling one internal function group among said "at least two internal function groups" to another internal function group among said "at least two internal function groups."

14. The apparatus of claim 12 wherein:

the external circuitry includes a plurality of external circuits, each external circuit having an enable line coupled to the configuration circuit; and to couple a first external circuit to the integrated circuit chip, the configuration circuit drives an active signal on the enable line of the first external circuit.

15. The apparatus of claim 14 wherein:

one of the functional modules includes a video input interface circuit;

one of the external circuits includes a video decoder for coupling to the video input interface circuit;

another of the functional modules includes a video output interface circuit; and one of the external circuits includes a video encoder 164 for coupling to the video output interface circuit.

16. The apparatus of claim 14 wherein:

yet another of the functional modules includes a display controller; and yet another of the external circuits includes a panel link encoder for coupling to the display controller 124.

17. A method for forming a plurality of couplings between a plurality of internal ports and a plurality of external ports of a crossbar switch inside an integrated circuit chip, the plurality of internal ports being coupled to a corresponding plurality of functional modules in the integrated circuit chip, and the plurality of external ports being coupled to a corresponding plurality of groups of pads of the integrated circuit chip, the method comprising:

coupling a first external port in said plurality of external ports to a first internal port in said plurality of internal ports; and in response to a control signal:
decoupling the first external port from the first internal port and coupling the first external port to a second internal port in said plurality of internal ports;

wherein the external ports are smaller in number than the internal ports, and the first internal port remains uncoupled from all external ports while the first external port is coupled to the second internal port.

18. The method of claim 17 further comprising:

resetting a power supply of the integrated circuit chip subsequent to said decoupling and prior to said "coupling the first external port."

19. The method of claim 17 further comprising:

supplying an enable signal to a first function module; and subsequent to said supplying, passing to the first external port a first data signal from the first function module via the second internal port.

20. The method of claim 17 further comprising:

passing a test signal from the first internal port to the first external port.

21. The method of claim 17 further comprising:

coupling a second external port to a third external port; and passing a test signal from the second external port to the third external port.

22. The method of claim 17 being devoid of an act of:

resetting a power supply of the integrated circuit chip subsequent to said decoupling and prior to said "coupling the first external port."

* * * * *